United States Patent
Tanishima

[19]

[11] Patent Number: 6,111,468
[45] Date of Patent: Aug. 29, 2000

[54] CHARGE PUMP WITH CHARGE/ DISCHARGE AMOUNT CONTROL

[75] Inventor: Hideaki Tanishima, Kasugai, Japan

[73] Assignee: Fujitsu Limited, Kanagawa, Japan

[21] Appl. No.: 09/104,175

[22] Filed: Jun. 25, 1998

[30] Foreign Application Priority Data

Feb. 6, 1998 [JP] Japan .................................. 10-026060

[51] Int. Cl.$^7$ ...................................................... H03L 7/00
[52] U.S. Cl. ................................ 331/17; 331/25; 327/148
[58] Field of Search ........................ 331/17, 25; 327/148, 327/157, 536, 537

[56] References Cited

U.S. PATENT DOCUMENTS

| | | | |
|---|---|---|---|
| 5,075,640 | 12/1991 | Miyazawa | ................................... 331/10 |
| 5,357,216 | 10/1994 | Nguyen | ...................................... 331/25 |
| 5,508,660 | 4/1996 | Gersbach et al. | .......................... 331/17 |
| 5,592,120 | 1/1997 | Palmer et al. | ............................ 327/536 |
| 5,722,052 | 2/1998 | Abdi et al. | ................................. 455/75 |

*Primary Examiner*—Benny Lee
*Assistant Examiner*—Henry Choe
*Attorney, Agent, or Firm*—Arent, Fox Kintner Plotkin & Kahn

[57] ABSTRACT

A charge pump circuit which may be used in a PLL includes a charge/discharge circuit, a detection circuit and an adjusting circuit. The charge/discharge circuit performs a charge operation in response to a first pulse signal and a discharge operation in response to a second pulse signal and outputs an output signal having a voltage based on the charge and the discharge operations. The detection circuit detects whether a charge operation or a discharge operation was performed and generates a control signal. The adjusting circuit adjusts the charge and discharge operations so that a charge amount and a discharge amount per unit time become substantially equal to each other.

33 Claims, 20 Drawing Sheets

Fig. 10 (Prior Art)
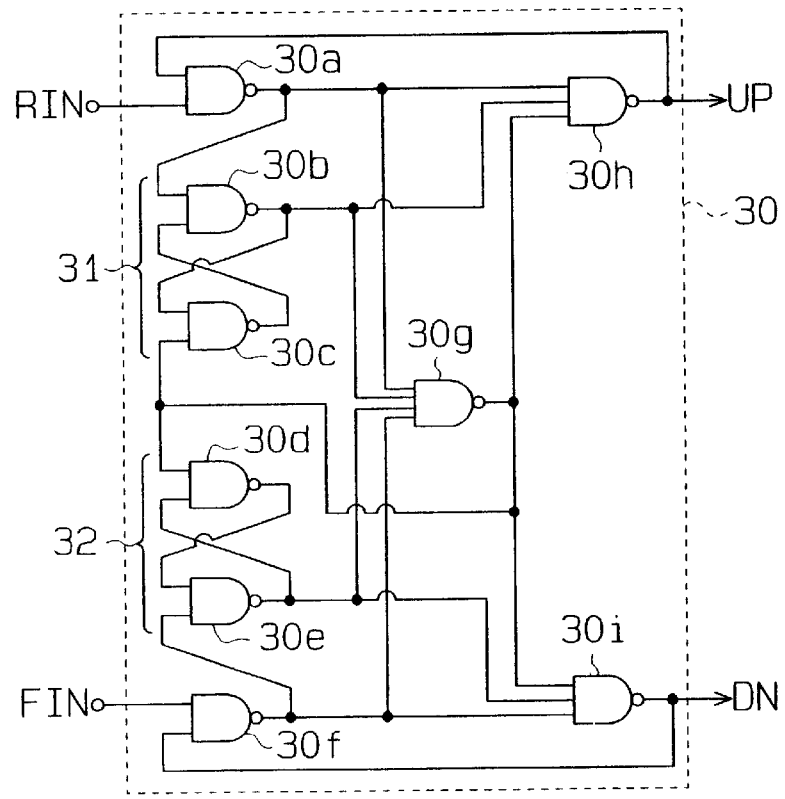
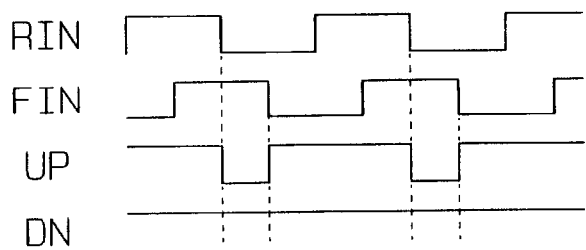
Fig. 11 (a) (Prior Art)
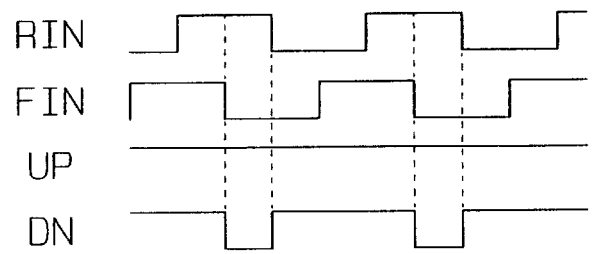
Fig. 11 (b) (Prior Art)

CHARGE PUMP WITH CHARGE/DISCHARGE AMOUNT CONTROL

BACKGROUND OF THE INVENTION

The present invention relates to a charge pump which is to be installed in a PLL circuit, and, more particularly, to a charge pump which quickly locks its frequency to a desired frequency and maintain a stable frequency output signal.

FIG. 1 is a schematic block diagram of a conventional PLL circuit 10. The PLL circuit 10 has a phase comparator 11, a charge pump 12, a low-pass filter (LPF) 13, a voltage controlled oscillator (VCO) 14 and a frequency divider 15. The phase comparator 11 provides the charge pump 12 with first and second phase difference signals UP and DN which have pulse widths according to a phase difference between a reference signal RIN having a predetermined frequency and a frequency-divided signal FIN from the frequency divider 15. The charge pump 12 sends the LPF 13 an output signal Co which varies in accordance with the pulse widths of the first and second phase difference signals UP and DN. The LPF 13 smoothes the output signal Co from the charge pump 12 and supplies a DC voltage signal Lo to the VCO 14. The VCO 14 sends an external circuit an oscillation output signal Fout having a frequency according to the voltage value of the DC voltage signal Lo. The VCO 14 also sends the oscillation output signal Fout to the frequency divider 15. The frequency divider 15 frequency divides the oscillation output signal Fout and sends the resultant frequency-divided signal FIN to the phase comparator 11. The PLL circuit 10 operates such that the frequency of the oscillation output signal Fout output from the VCO 14 substantially matches, or is locked to a desired frequency.

FIG. 4 is a circuit diagram of the phase comparator 11. The phase comparator 11 has four or first to fourth D flip-flops (DFs) 21 to 24, and exclusive OR (EOR) gates 25 and 26. The phase comparator 11 operates according to the timing charts illustrated in FIGS. 5 to 7. FIG. 5 shows an example where the rising of the reference signal RIN coincides with the rising of the frequency-divided signal FIN. In this case, since the phase of the reference signal RIN substantially coincides with the phase of the frequency-divided signal FIN, the phase comparator 11 outputs the first and second phase difference signals UP and DN which have the same pulse width. FIG. 6 shows an example where the rising of the reference signal RIN comes later than the rising of the frequency-divided signal FIN. In this case, the phase of the frequency-divided signal FIN leads the phase of the reference signal RIN, and the phase comparator 11 outputs the first phase difference signal UP whose pulse width is narrower than that of the second phase difference signal DN. FIG. 7 depicts an example where the rising of the reference signal RIN comes earlier than the rising of the frequency-divided signal FIN. In this case, the phase of the reference signal RIN leads the phase of the frequency-divided signal FIN, and the phase comparator 11 outputs the first phase difference signal UP whose pulse width is wider than that of the second phase difference signal DN.

As shown in FIG. 2, the charge pump 12 includes a P channel MOS (PMOS) transistor TP1 and an N channel MOS (NMOS) transistor TN1 connected in series between a first power supply line L1 connected to a high-potential voltage supply $V_{DD}$ and a second power supply line L2 connected to a low-potential voltage supply $V_{SS}$. The PMOS transistor TP1 has a source which is supplied with the voltage of the high-potential voltage supply $V_{DD}$, a drain connected to the drain of the NMOS transistor TN1 and a gate to which the first phase difference signal UP is input. The NMOS transistor TN1 has a source which is supplied with the voltage of the low-potential voltage supply $V_{SS}$ and a gate which is supplied with the second phase difference signal DN. A node N1 between the drains of the transistors TP1 and TN1 serves as a terminal for outputting the output signal Co from the charge pump 12.

As the PMOS transistor TP1 is turned on in response to the first phase difference signal UP of an L level, the charge pump 12 performs a charge operation to let the current flow to the LPF 13 to increase the amount of charge in the LPF 13. The LPF 13, which includes a resistor and a capacitor, raises the voltage of the output signal Lo with an increase in the amount of charge. That is, the charge pump 12 carries out the charge operation in a period where the first phase difference signal UP has an L level.

As the NMOS transistor TN1 is turned on in response to the second phase difference signal DN of an H level, the charge pump 12 performs a discharge operation to drain the current from the LPF 13, which reduces the amount of charge stored in the LPF 13. The LPF 13 decreases the voltage of the output signal Lo in accordance with a decrease in the amount of charge. That is, the charge pump 12 carries out the discharge operation in a period where the second phase difference signal DN has an H level.

In the example of FIG. 5, as the phase comparator 11 outputs the first and second phase difference signals UP and DN which have the same pulse width, the charge pump 12 carries out a charge operation (pumping out the current I (Co) (positive side)) and a discharge operation (pumping up the current I (Co) (negative side)) for the same period of time. As shown in FIG. 8(a), therefore, the voltage V (Lo) of the output signal Lo of the LPF 13 does not vary and the VCO 14 holds the frequency of the output signal Fout.

In the example of FIG. 7, as the phase comparator 11 outputs the first phase difference signal UP which has a wider pulse width than the second phase difference signal DN, the charge pump 12 carries out a longer charge operation than a discharge operation. In other words, the charge pump 12 executes pumping-out of the current I (Co) (positive side) longer than pumping-up of the current I (Co) (negative side). As shown in FIG. 8(b), therefore, the voltage V (Lo) of the output signal Lo of the LPF 13 rises and the VCO 14 increases the frequency of the output signal Fout.

In the example of FIG. 6, as the phase comparator 11 outputs the first phase difference signal UP which has a narrower pulse width than the second phase difference signal DN, the charge pump 12 performs a shorter charge operation than a discharge operation. That is, the charge pump 12 executes pumping-up of the current I (Co) (negative side) longer than pumping-out of the current I (Co) (positive side). As shown in FIG. 8(c), therefore, the voltage V (Lo) of the output signal Lo of the LPF 13 drops, causing the VCO 14 to decrease the frequency of the output signal Fout.

Referring to FIG. 3, an equivalent circuit of the charge pump 12 is shown as first and second resistors R1 and R2 connected in series between the first and second power supply lines L1 and L2. A voltage difference between the voltage of the high-potential voltage supply $V_{DD}$ and the voltage of the low-potential voltage supply $V_{SS}$ is constant. Therefore, when the potential at the node N1 is high and increased close to the voltage of the high-potential voltage supply $V_{DD}$ for example, a potential difference across the first resistor R1 becomes smaller than a potential difference across the second resistor R2. When the potential at the node N1 is low and decreased close to the voltage of the low-potential voltage supply $V_{SS}$, a potential difference across the first resistor R1 becomes larger than a potential difference across the second resistor R2.

The potential differences across the first and second resistors R1 and R2 are the source-drain potential differences of the transistors TP1 and TN1, respectively. Thus, each transistor TP1 or TN1 has a greater drive performance as the source-drain potential difference becomes larger, and has a smaller drive performance as the source-drain potential difference becomes smaller. In a greater drive performance, a large current flows in the transistor, whereas with a smaller drive performance, little current flows in the transistor. The drive performances of the individual transistors TP1 and TN1 have the following influences on the operation of the PLL circuit 10.

When the potential at the node N1 is high and increased close to the voltage of the high-potential voltage supply $V_{DD}$, as the drive performance of the NMOS transistor TN1 is greater than that of the PMOS transistor TP1, more current flows in the NMOS transistor TN1 than the PMOS transistor TP1 even when the first and second phase difference signals UP and DN are input. Consequently, the charge amount gets larger than the discharge amount.

FIG. 9 shows, in a matrix form, the ratios of the charge amount by the PMOS transistor TP1 to the discharge amount by the NMOS transistor TN1 based on the relationship between the voltage V(N1) at the node N1 and the phase difference between the reference signal RIN and the frequency-divided signal FIN. In FIG. 9, the ratios are given by numerals above the waveforms. In the case of the center portion in FIG. 9 (where the phases of both signals RIN and FIN substantially coincide with each other and the voltage V(N1) at the node N1 is set near the midway between the voltage of the high-potential voltage supply $V_{DD}$ and the voltage of the low-potential voltage supply $V_{SS}$), for example, the ratio of the charge amount to the discharge amount is 4:4.

In the case of the lower center portion in FIG. 9 (where both signals RIN and FIN are substantially in phase with each other and the voltage at the node N1 is high), a large current flows in the NMOS transistor TN1 so that the ratio of the charge amount to the discharge amount is 2:6. In this case, the voltage V (Lo) of the output signal Lo of the LPF 13 drops and the frequency of the oscillation output signal Fout from the VCO 14 is decreases. This leads to a malfunction where the oscillation output signal Fout of the PLL circuit 10 is unlocked. That is, the oscillation output signal Fout of the PLL circuit 10 decreases even though the reference signal RIN is substantially in phase with the frequency-divided signal FIN and the frequencies of both signals are substantially the same.

In the lower left case in FIG. 9, where the phase of the frequency-divided signal FIN lags behind the phase of the reference signal RIN and the voltage at the node N1 is high, a large current flows in the NMOS transistor TN1, increasing the discharge amount, so that the ratio of the charge amount to the discharge amount becomes 3:3. In this case, the LPF 13 outputs the output signal Lo having a constant voltage V(Lo). The VCO 14 sends out the oscillation output signal Fout having a constant frequency in response to the output signal Lo of the LPF 13. As a result, the frequency of the oscillation output signal Fout does not vary regardless of the delayed phase of the frequency-divided signal FIN. In other words, while the voltage at the node N1 is held high, the oscillation output signal Fout with a constant frequency is output.

In the lower right case in FIG. 9, where the phase of the frequency-divided signal FIN leads the phase of the reference signal RIN and the voltage at the node N1 is high, the discharge amount increases so that the ratio of the charge amount to the discharge amount becomes 1:9. In this case, the LPF 13 drastically drops the voltage V(Lo) of the output signal Lo. The VCO 14 sharply decreases the frequency of the oscillation output signal Fout in response to the output signal Lo of the LPF 13. Consequently, the frequency of the oscillation output signal Fout overshoots (undershoots) the desired frequency, increasing the lockup time of the oscillation output signal Fout.

In the upper left case in FIG. 9, where the phase of the frequency-divided signal FIN lags behind the phase of the reference signal RIN and the voltage at the node N1 is low, the charge amount increases so that the ratio of the charge amount to the discharge amount becomes 9:1. In this case, the VCO 14 rapidly increases the frequency of the oscillation output signal Fout in response to the output signal Lo of the LPF 13. As a result, the lockup time of the PLL circuit increases.

In the upper right case in FIG. 9, where the phase of the frequency-divided signal FIN leads the phase of the reference signal RIN and the voltage at the node N1 is low, the charge amount increases so that the ratio of the charge amount to the discharge amount becomes 3:3. In this case, the VCO 14 sends out the oscillation output signal Fout having a constant frequency in response to the output signal Lo of the LPF 13. Consequently, the frequency of the oscillation output signal Fout is not locked to a predetermined frequency.

FIG. 10 is a schematic block diagram of a conventional phase comparator 30 which has been improved with respect to the above problem. The phase comparator 30 has nine or first through ninth NAND gates 30a to 30i. The second and third NAND gates 30b and 30c form a first flip-flop 31, and the fourth and fifth NAND gates 30d and 30e form a second flip-flop 32.

When the phase of the frequency-divided signal FIN lags behind the phase of the reference signal RIN, as shown in FIG. 11(a), the phase comparator 30 outputs the first phase difference signal UP whose pulse width corresponds to the phase difference and the second phase difference signal DN having a predetermined level. The second phase difference signal DN is inverted by an inverter circuit (not shown) and is then applied to the gate of the NMOS transistor TN1 of the charge pump 12. The charge pump 12 carries out only a charge operation in response to the first and second phase difference signals UP and DN.

When the phase of the frequency-divided signal FIN leads the phase of the reference signal RIN, as shown in FIG. 11(b), the phase comparator 30 outputs the second phase difference signal DN whose pulse width corresponds to the phase difference and the first phase difference signal UP having a predetermined level. The charge pump 12 carries out only a discharge operation in response to the first and second phase difference signals UP and DN.

When the reference signal RIN is substantially in phase with the frequency-divided signal FIN, the phase comparator 30 outputs the first and second phase difference signals UP and DN having a predetermined level. As the charge pump 12 does not perform a charge/discharge operation in response to the first and second phase difference signals UP and DN having the predetermined level, the voltage of the output signal from the charge pump 12 is kept constant, as shown in FIG. 12. This keeps the frequency of the oscillation output signal Fout constant so that the oscillation output signal Fout is locked.

When the voltage V(N1) at the node N1 is high, however, the drive performance of the PMOS transistor TP1 decreases, reducing the charge amount. Consequently, the charge operation of the charge pump 12 becomes slower and the speed of the voltage rise of the output signal Lo of the LPF 13 gets slower. As a result, the frequency of the oscillation output signal Fout from the VCO 14 is slightly increased. This slow charge operation elongates the lockup time of the oscillation output signal Fout.

Accordingly, it is an object of present invention to provide a charge pump having a decreased lock time while improving the frequency stability.

SUMMARY OF THE INVENTION

Briefly stated, the present invention provides a charge pump including a charge/discharge circuit, a detection circuit connected to the charge/discharge circuit, and an adjusting circuit connected to the detection circuit and the charge/discharge circuit. The charge/discharge circuit performs a charge operation in response to a first pulse signal, performs a discharge operation in response to a second pulse signal and outputs an output signal having a voltage based on the charge operation and the discharge operation from an output terminal. The detection circuit detects a status of the charge operation and the discharge operation and generates a control signal representing a detection result. The adjusting circuit adjusts the charge operation and the discharge operation such that a charge amount and a discharge amount per unit time become substantially equal to each other.

The present invention provides a charge pump including: charge and discharge transistors connected in series between a high-potential voltage supply and a low-potential voltage supply; a first transistor, a resistor and a second transistor connected in series between the high-potential voltage supply and the low-potential voltage supply; a third transistor connected between a first node between the first transistor and the resistor, and a gate of the charge transistor and responsive to a first pulse signal; and a fourth transistor connected between a second node between the second transistor and the resistor, and a gate of the discharge transistor and responsive to a second pulse signal. The gates of the first and second transistors are connected to a third node between the charge transistor and the discharge transistor.

The present invention also provides a charge pump including: a main charge transistor and a main discharge transistor connected in series between a high-potential voltage supply and a low-potential voltage supply; a group of auxiliary charge transistors including first and second auxiliary charge transistors connected in series between a node between the main charge transistor and the main discharge transistor, and the high-potential voltage supply; a group of auxiliary discharge transistors including first and second auxiliary discharge transistors connected in series between the node and the low-potential voltage supply; and an A/D converter, connected to the node, for converting an analog signal at the node to a digital signal. A gate of the first auxiliary charge transistor is connected to a gate of the main charge transistor, and a gate of the second auxiliary charge transistor is responsive to the digital signal. A gate of the first auxiliary discharge transistor is connected to a gate of the main discharge transistor, and a gate of the second auxiliary discharge transistor is responsive to the digital signal.

The present invention provides a charge pump comprising: a charge transistor and a discharge transistor connected in series between a high-potential voltage supply and a low-potential voltage supply; first and second transistors connected in series between the charge transistor and the discharge transistor, a gate of the first transistor being connected to a first node between the first transistor and the charge transistor, a gate of the second transistor being connected to a second node between the second transistor and the discharge transistor; a first operational amplifier having a first input terminal connected to the first node, a second input terminal connected to a third node between the first and second transistors, and an output terminal; a second operational amplifier having a first input terminal connected to the second node, a second input terminal connected to the third node, and an output terminal; a third transistor connected between the high-potential voltage supply and a gate of the charge transistor; and a fourth transistor connected between the low-potential voltage supply and a gate of the discharge transistor. A gate of the third transistor is connected to the output terminal of the first operational amplifier, and a gate of the fourth transistor is connected to the output terminal of the second operational amplifier.

The present invention further provides a charge pump including: a charge transistor and a discharge transistor connected in series between a high-potential voltage supply and a low-potential voltage supply; a group of auxiliary charge transistors including first and second auxiliary charge transistors connected in series between the high-potential voltage supply and a first node between the charge transistor and the discharge transistor;

a group of auxiliary discharge transistors including first and second auxiliary discharge transistors connected in series between the low-potential voltage supply and the first node; a first operational amplifier having a first input terminal connected to the first node, a second input terminal connected to a second node between the high-potential voltage supply and the charge transistor, and an output terminal; and a second operational amplifier having a first input terminal connected to the first node, a second input terminal connected to a third node between the low-potential voltage supply and the discharge transistor, and an output terminal. A gate of the first auxiliary charge transistor is connected to a gate of the charge transistor, and a gate of the second auxiliary charge transistor is connected to the output terminal of the first operational amplifier. A gate of the first auxiliary discharge transistor is connected to a gate of the discharge transistor, and a gate of the second auxiliary discharge transistor is connected to the output terminal of the second operational amplifier.

The present invention provides a charge pump including: a charge transistor and a discharge transistor connected in series between a high-potential voltage supply and a low-potential voltage supply; a first resistor and a first current detection circuit connected in series between a first node between the charge transistor and the discharge transistor, and a second node between the high-potential voltage supply and the charge transistor; a second resistor and a second current detection circuit connected in series between the first node and a third node between the low-potential voltage supply and the discharge transistor; an operational amplifier having a first input terminal connected to an output of the first current detection circuit, a second input terminal connected to an output of the second current detection circuit, and an output terminal; a first transistor connected between the high-potential voltage supply and a gate of the charge transistor; and a second transistor connected between the low-potential voltage supply and a gate of the discharge transistor. The first and second transistors have gates connected to the output terminal of the operational amplifier.

The present invention provides a charge pump including: a charge transistor and a discharge transistor connected in series between a high-potential voltage supply and a low-potential voltage supply; a group of auxiliary charge transistors including first and second auxiliary charge transistors connected in series between the high-potential voltage supply and a first node between the charge transistor and the discharge transistor; a group of auxiliary discharge transistors including first and second auxiliary discharge transistors connected in series between the low-potential voltage supply and the first node; a first resistor and a first current detection circuit connected in series between the first node and a second node between the charge transistor and the high-potential voltage supply; a second resistor and a second current detection circuit connected in series between the first node and a third node between the discharge transistor and the low-potential voltage supply; an operational amplifier having a first input terminal connected to an output of the first current detection circuit, a second input terminal connected to an output of the second current detection circuit, and an output terminal. A gate of the first auxiliary charge transistor is connected to a gate of the charge transistor, and a gate of the second auxiliary charge transistor is connected to the output terminal of the operational amplifier. A gate of the first auxiliary discharge transistor is connected to a gate of the discharge transistor, and a gate of the second auxiliary discharge transistor is connected to the output terminal of the operational amplifier.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 10 is a block circuit diagram of second conventional phase comparator;

FIGS. 11(a) and 11(b) are timing charts of the phase comparator in FIG. 10;

DETAILED DESCRIPTION OF THE PREFERRED EMBODIMENTS

Figure 13:
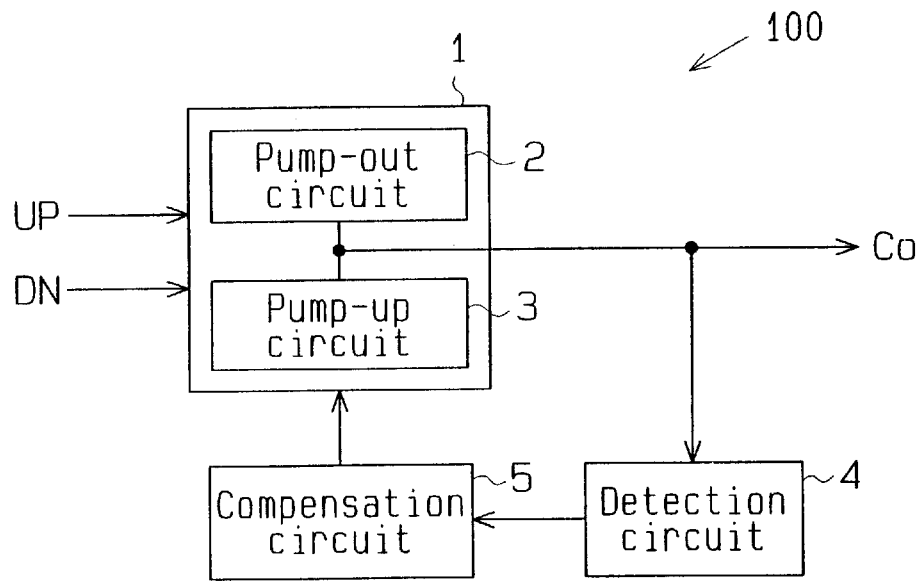
FIG. 13 is a block diagram of a charge pump according to the present invention.

In the drawings, like numerals are used for like elements. FIG. 13 is a block diagram of a charge pump 100 according to the present invention. The charge pump 100 comprises a charge/discharge circuit 1, a detection circuit 4 and a compensation circuit 5. The charge/discharge circuit 1 includes a pump-out circuit 2 which performs a charge operation in response to a first pulse signal DN and a pump-up circuit 3 which performs a discharge operation in response to a second pulse signal DN. A node between the pump-out circuit 2 and the pump-up circuit 3 serves as an output terminal for outputting an output signal Co of the charge/discharge circuit 1. The detection circuit 4, connected to the output terminal, detects the status of the pump-out circuit 2 and the pump-up circuit 3 and outputs a control signal based on the detection result. The compensation circuit 5 controls the pump-out circuit 2 and the pump-up circuit 3 to compensate for a balance between the charge amount of the pump-out circuit 2 and the discharge amount of the pump-up circuit 3 in accordance with the control signal.

Figure 14:
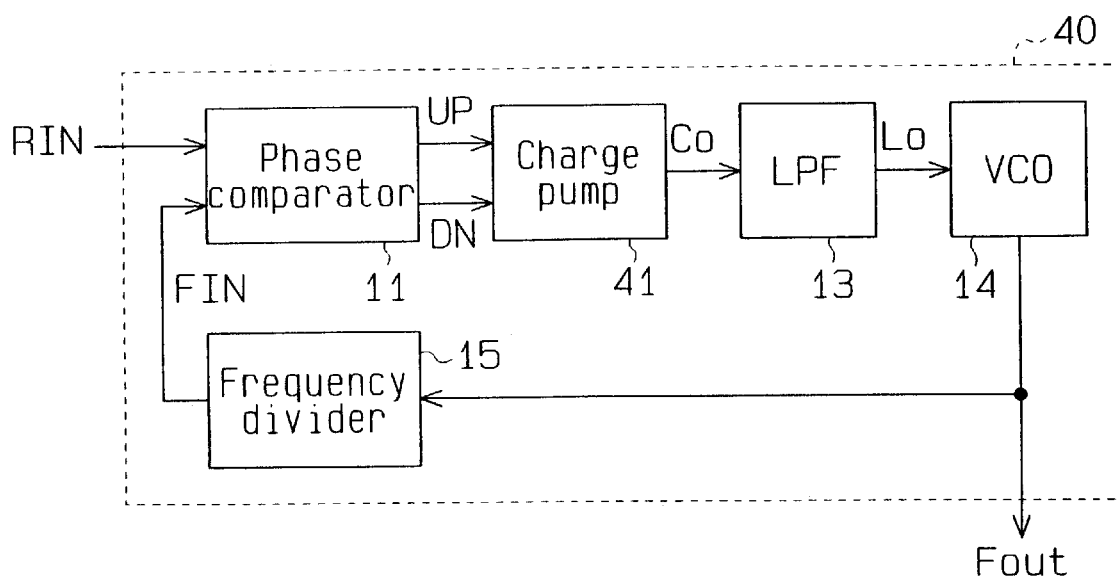
FIG. 14 is a block circuit diagram of a PLL circuit including a charge pump according to a first embodiment of the present invention.

FIG. 14 is a schematic block circuit diagram of a PLL circuit 40 having a charge pump 41 according to a first embodiment of the present invention. The PLL circuit 40 further has a phase comparator 11, a low-pass filter (LPF) 13, a voltage controlled oscillator (VCO) 14 and a frequency divider 15. The charge pump 41 receives first and second phase difference signals UP and DN from the phase comparator 11 and sends the LPF 13 an output signal Co which varies in accordance with the pulse widths of the first and second phase difference signals UP and DN. Because the phase comparator 11, the LPF 13, the VCO 14 and the frequency divider 15 may have the same structures as those of the prior art, descriptions thereof will not be repeated.

Figure 15:
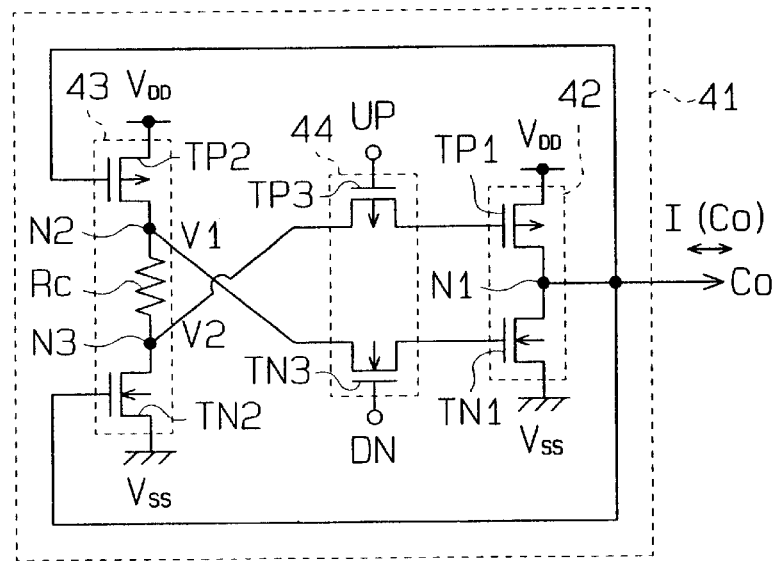
FIG. 15 is a circuit diagram of the charge pump according to the first embodiment of the invention.

FIG. 15 is a circuit diagram of the charge pump 41, which includes first to third P channel MOS (PMOS) transistors TP1 to TP3, first to third N channel MOS (NMOS) transistors TN1 to TN3, and a resistor Rc. The first PMOS transistor TP1 and the first NMOS transistor TN1 form a series circuit, and serves as a charge/discharge (C/D) circuit 42 which performs charging/discharging with respect to the LPF 13.

Specifically, the first PMOS transistor TP1 has a source connected to a high-potential voltage supply $V_{DD}$, a drain connected to the drain of the first NMOS transistor TN1 and a gate. The first NMOS transistor TN1 has a source connected to a low-potential voltage supply $V_{SS}$ and a gate. A node N1 between the drain of the first PMOS transistor TP1 and the drain of the first NMOS transistor TN1 is a terminal for outputting the output signal from the charge pump 41.

When the first PMOS transistor TP1 is turned on with a predetermined voltage applied to its gate, a current I(Co) is supplied via the node N1 to the LPF 13 from the high-potential voltage supply $V_{DD}$, charging the LPF 13. The charge determines the voltage at the node N1 or the voltage of the output signal Co. The LPF 13 smoothes the output signal Co and outputs an output signal Lo having a high voltage in accordance with the amount of stored charge. Therefore, the first PMOS transistor TP1 forms a pump-out circuit which pumps out a current to the LPF 13.

When the first NMOS transistor TN1 is turned on with a predetermined voltage applied to its gate, the current I(Co) flows to the low-potential voltage supply $V_{SS}$ from the LPF 13 via the node N1, reducing the amount of charge of the LPF 13. The discharging of the LPF 13 causes the LPF 13 to output the output signal Lo which has a low voltage according to the reduced amount of charge. Therefore, the first NMOS transistor TN1 forms a pump-up circuit which pumps up a current from the LPF 13.

The second PMOS transistor TP2, the resistor Rc and the second NMOS transistor TN2 are connected in series between the high-potential voltage supply $V_{DD}$ and the low-potential voltage supply $V_{SS}$. This series circuit serves as a detection circuit 43, which receives the output signal Co and detects if the voltage of the output signal Co is increased close to the voltage of the high-potential voltage supply $V_{DD}$ or the voltage of the low-potential voltage supply $V_{SS}$. The detection circuit 43 sends out the detection result on the output signal Co as a divided voltage V1 or V2. The third PMOS and NMOS transistors TP3 and TN3 serve as a compensation circuit 44 which compensates for the charge/discharge amount of the C/D circuit 42 based on the detection result from the detection circuit 43.

Specifically, the second PMOS transistor TP2 has a gate connected to the node N1, a source connected to the power supply line of the high-potential voltage supply $V_{DD}$ and a drain connected to a first terminal (node N2) of the resistor Rc. The second NMOS transistor TN2 has a gate connected to the node N1, a source connected to the power supply line of the low-potential voltage supply $V_{SS}$ and a drain connected to a second terminal (node N3) of the resistor Rc.

Figures 16A, 16B, 16C:
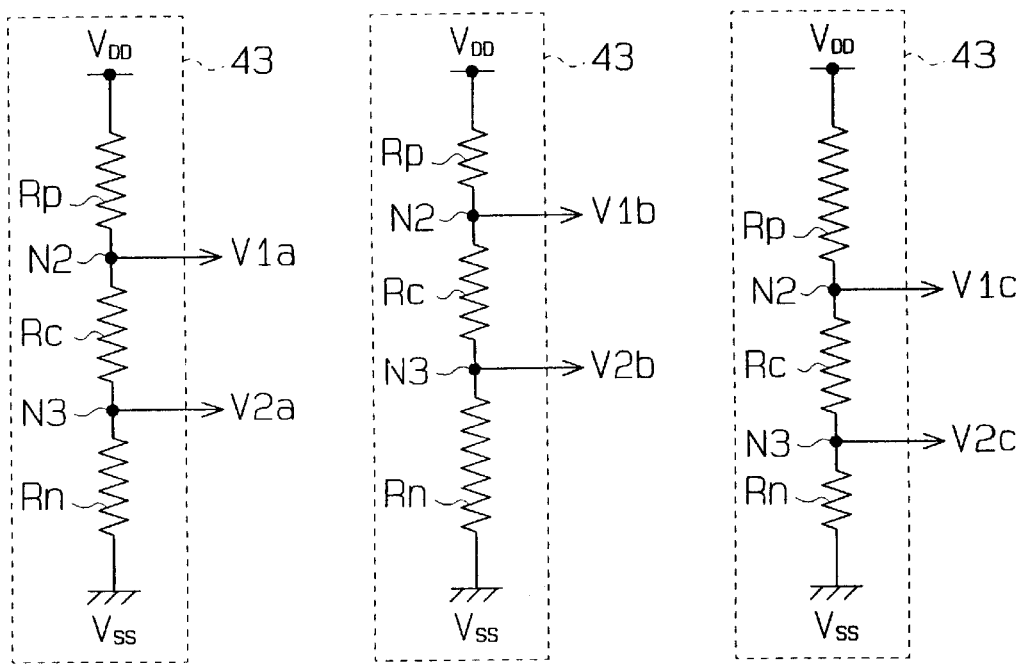
FIGS. 16(a) through 16(c) are diagrams showing changes in an internal resistor in the charge pump in FIG. 15.

The gates of the second PMOS and NMOS transistors TP2 and TN2 receive the voltage at the node N1 or the output signal Co. Therefore, the second PMOS transistor TP2 is equivalent to a resistor having an ON resistance corresponding to a difference between the voltage of the output signal Co and the voltage of the high-potential voltage supply $V_{DD}$. Likewise, the second NMOS transistor TN2 is equivalent to a resistor having an ON resistance corresponding to a difference between the voltage of the output signal Co and the voltage of the low-potential voltage supply $V_{SS}$. FIGS. 16(a)–16(c) are equivalent circuit diagrams of the detection circuit 43 in which varying voltage values are illustrated by varying the illustrated size of resistors Rp and Rn.

FIG. 16(a) shows an equivalent circuit in which the second PMOS transistor TP2 is represented by a resistor Rp and the second NMOS transistor TN2 is represented by a resistor Rn. At the nodes N2 and N3, divided voltages V1 and V2 are acquired by dividing the potential difference between the high-potential voltage supply $V_{DD}$ and the low-potential voltage supply $V_{SS}$ by the individual resistors Rp, Rc and Rn. The potential difference between the high-potential voltage supply $V_{DD}$ and the low-potential voltage supply $V_{SS}$ is constant, and the resistor Rc has a constant resistance. The divided voltages V1 and V2 are thus determined by the resistances of the resistors Rp and Rn.

When the voltage of the output signal Co is in the vicinity of an intermediate voltage (½ ($V_{DD}$+$V_{SS}$) between the voltage of the high-potential voltage supply $V_{DD}$ and the voltage of the low-potential voltage supply $V_{SS}$, as shown in FIG. 16(a), the gate-source voltage of the second PMOS transistor TP2 is substantially equal to the gate-source voltage of the second NMOS transistor TN2, so that the ON resistances of both transistors TP2 and TN2 are substantially the same. Therefore, the difference between the voltage of the high-potential voltage supply $V_{DD}$ and the voltage at the node N2 is substantially equal to the difference between the voltage at the node N3 and the voltage of the low-potential voltage supply $V_{SS}$. Accordingly, predetermined divided voltages V1a and V2a appear at the nodes N2 and N3.

When the voltage of the output signal Co is decreased close to the voltage of the low-potential voltage supply $V_{SS}$ (lower than the intermediate voltage), as shown in FIG. 16(b), the ON resistance of the second PMOS transistor TP2 (resistor Rp) is lower than the resistance of the second NMOS transistor TN2 (resistor Rn). Therefore, divided voltages V1b and V2b higher than the predetermined divided voltages V1a and V2a appear at the nodes N2 and N3.

When the voltage of the output signal Co is increased close to the voltage of the high-potential voltage supply $V_{DD}$ (higher than the intermediate voltage), as shown in FIG. 16(c), the ON resistance of the second PMOS transistor TP2 becomes greater than the resistance of the second NMOS transistor TN2. Therefore, divided voltages V1c and V2c lower than the predetermined divided voltages V1a and V2a appear at the nodes N2 and N3.

As shown in FIG. 15, the node N2 between the second PMOS transistor TP2 and the resistor Rc is connected via the third NMOS transistor TN3 to the gate of the first NMOS transistor TN1. The third NMOS transistor TN3 has a gate to which the second phase difference signal DN is applied. The third NMOS transistor TN3 is turned on in response to the second phase difference signal DN having an H level, electrically connecting the node N2 to the gate of the first NMOS transistor TN1. While the second phase difference signal DN is kept having the H level, therefore, the first divided voltage V1 of the node N2 is applied to the gate of the first NMOS transistor TN1.

The first NMOS transistor TN1 performs a discharge operation to the LPF 13 in response to the first divided voltage V1 applied to its gate. The first divided voltage V1 corresponds to the gate-source voltage of the second PMOS transistor TP2 (i.e., the voltage difference between the voltage of the output signal Co and the voltage of the high-potential voltage supply $V_{DD}$). The first NMOS transistor TN1 permits the current to flow at a degree of conductivity which corresponds to the voltage difference. The drive performance (discharge amount) of the first NMOS transistor TN1 is therefore compensated in accordance with the first divided voltage V1 as the detection result from the detection circuit 43.

The node N3 between the second NMOS transistor TN2 and the resistor Rc is connected via the third PMOS transistor TP3 to the gate of the first PMOS transistor TP1. The third PMOS transistor TP3 has a gate to which the first phase difference signal UP is applied. The third PMOS transistor TP3 is turned on in response to the first phase difference signal UP having an L level, electrically connecting the node N3 to the gate of the first PMOS transistor TP1. While the first phase difference signal UP is kept having the L level, therefore, the voltage of the node N3 is applied to the gate of the first PMOS transistor TP1. The first PMOS transistor TP1 performs a charge operation to the LPF 13 in response to the second divided voltage V2 applied to its gate. The second divided voltage V2 corresponds to the gate-source voltage of the second NMOS transistor TN2 (i.e., the voltage difference between the voltage of the output signal Co and the voltage of the low-potential voltage supply $V_{SS}$). The first PMOS transistor TP1 permits the current to flow at a degree of conductivity which corresponds to the voltage difference. The drive performance (charge amount) of the first PMOS transistor TP1 is therefore compensated in accordance with the second divided voltage V2 as the detection result from the detection circuit 43.

The operation of the charge pump 41 will now be explained.

In a first case, when the voltage V(N1) of the output signal Co is generated near the intermediate voltage between the voltages of the high-potential voltage supply $V_{DD}$ and the low-potential voltage supply $V_{SS}$ the voltage difference between the gate and source of the second PMOS transistor TP2 is substantially equal to the voltage difference between the gate and source of the second NMOS transistor TN2. The ON resistance of the second PMOS transistor TP2 (the resistance of the resistor Rp) is thus substantially the same as the ON resistance of the second NMOS transistor TN2 (the resistance of the resistor Rn). Consequently, at nodes N2 and N3 respectively appear predetermined first and second divided voltages V1$a$ and V2$a$ such that the difference between the voltage of the high-potential voltage supply $V_{DD}$ and the first divided voltage V1 is substantially equal to the difference between the second divided voltage V2 and the voltage of the low-potential voltage supply $V_{SS}$.

The first transistors TP1 and TN1 permit the currents to flow at substantially the same degree of conductivity according to the first and second divided voltages V1 and V2, resulting in that the amounts of the currents flowing per unit time or the charge amount and the discharge amount become substantially the same. In this manner, the charge pump 41 performs charging/discharging of the LPF 13 with the amount of charge which corresponds to the pulse widths of the first and second phase difference signals UP and DN. The LPF 13 outputs the output signal Lo whose voltage corresponds to the amount of the stored charge. The VCO 14 holds or increases or decreases the frequency of the oscillation output signal Fout in response to the output signal Lo from the LPF 14.

In a second case, when the voltage V(N1) of the output signal Co is decreased close to the voltage of the low-potential voltage supply $V_{SS}$, the voltage difference between the gate and source of the second PMOS transistor TP2 becomes smaller than the voltage difference between the gate and source of the second NMOS transistor TN2. The detection circuit 43 therefore outputs the first and second divided voltages V1$b$ and V2$b$ higher than the predetermined first and second divided voltages V1$a$ and V1$b$ of the first case. The third PMOS transistor TP3 applies the second divided voltage V2$b$ to the gate of the first PMOS transistor TP1 in response to the first phase difference signal UP. The third NMOS transistor TN3 applies the first divided voltage V1$b$ to the gate of the first NMOS transistor TN1 in response to the second phase difference signal DN. As a result, the degree of conductivity of the first PMOS transistor TP1 becomes lower than that of the first NMOS transistor TN1. That is, the drive performance of the first PMOS transistor TP1 becomes lower, thus reducing the charge amount per unit time. Further, the drive performance of the first NMOS transistor TN1 becomes greater, increasing the discharge amount per unit time. Accordingly, the charge pump 41 supplies the output signal Co to the LPF 13 while compensating the balance between the charge amount and the discharge amount in accordance with first and second phase difference signals UP and DN.

Figure 1:
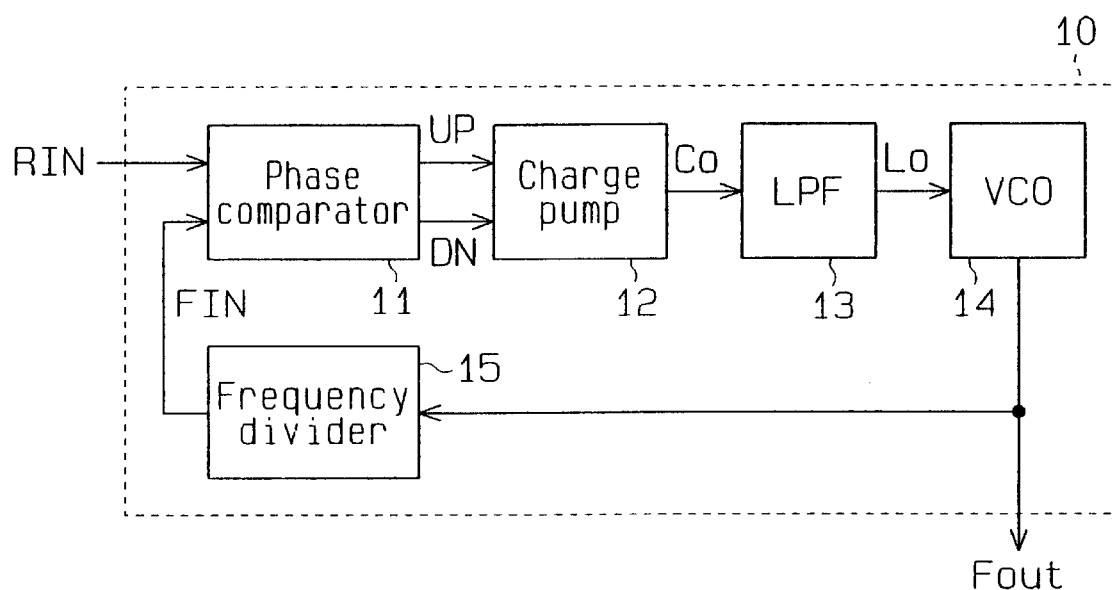
FIG. 1 is a schematic block diagram of a first conventional PLL circuit.
Figure 2:
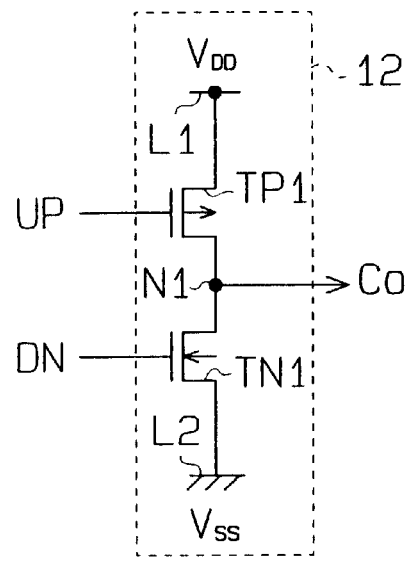
FIG. 2 is a circuit diagram of a charge pump of the PLL circuit in FIG. 1.
Figure 3:
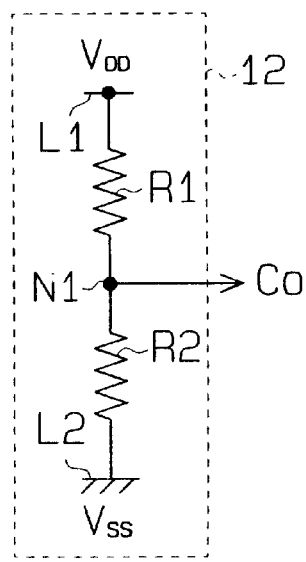
FIG. 3 is an equivalent circuit diagram of the charge pump in FIG. 2.
Figure 4:
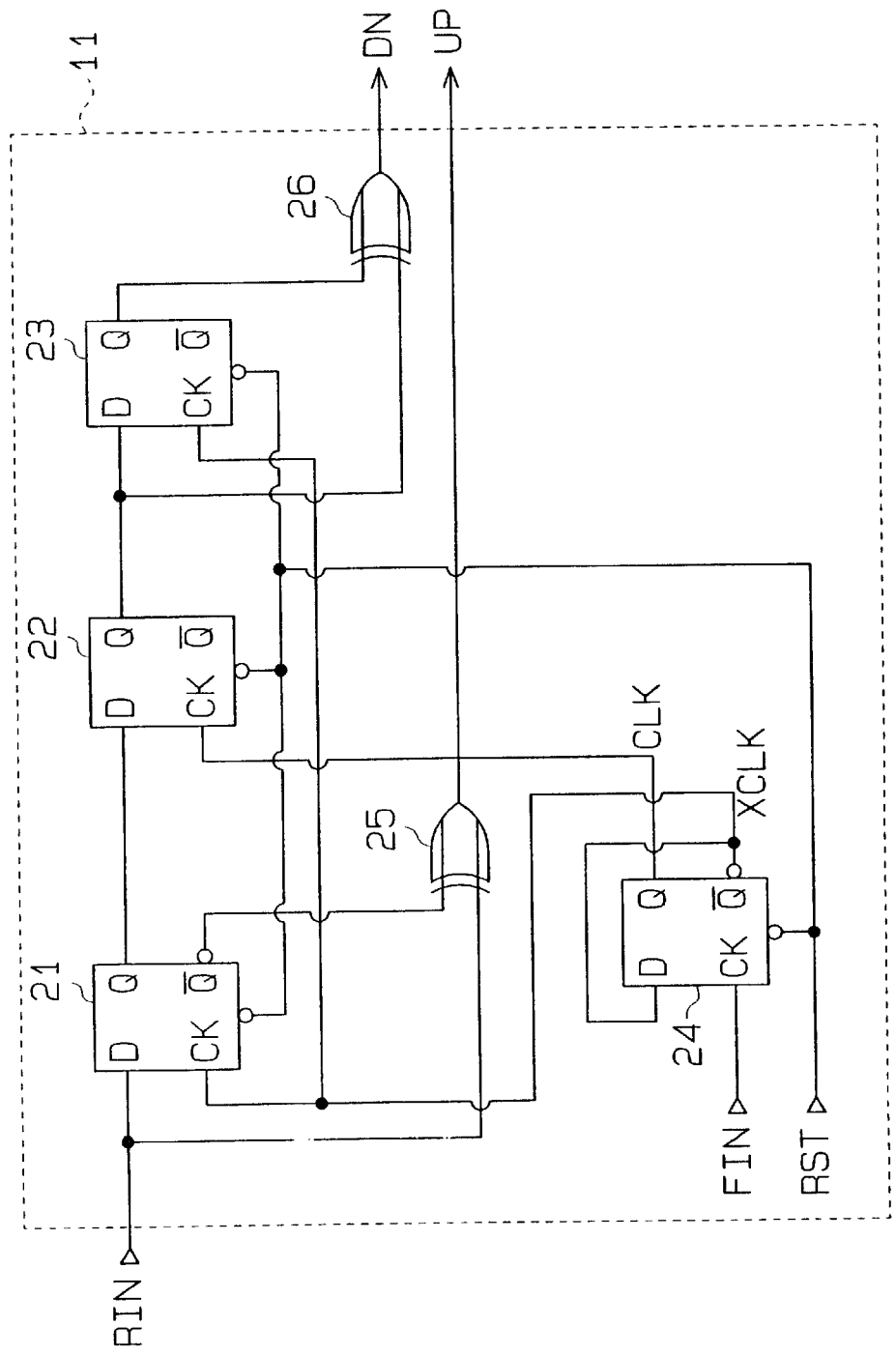
FIG. 4 is a block circuit diagram of a phase comparator of the PLL circuit in FIG. 1.
Figure 5:
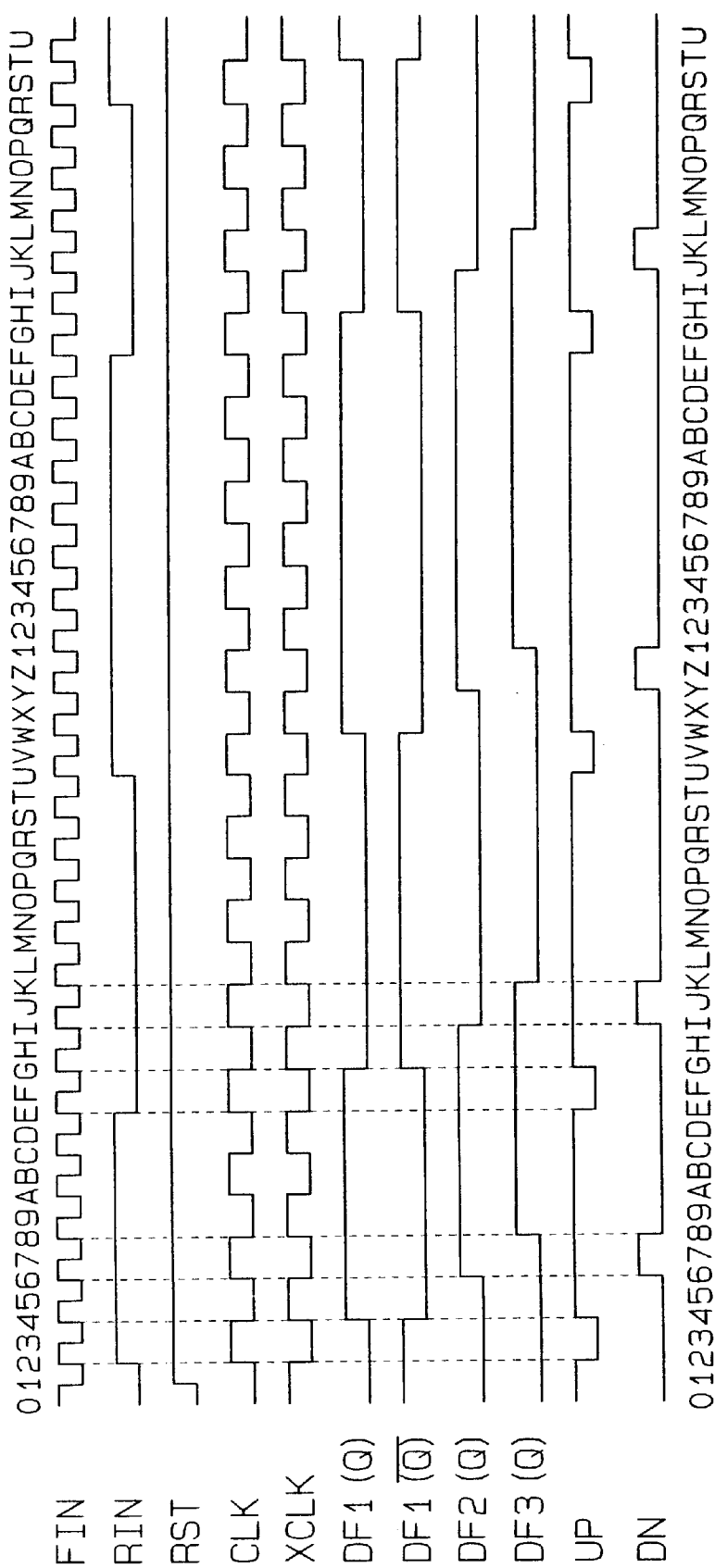
FIG. 5 is a timing chart for a case where the rising (falling) of a reference signal is in phase with the rising of a clock in the phase comparator in FIG. 4.
Figure 6:
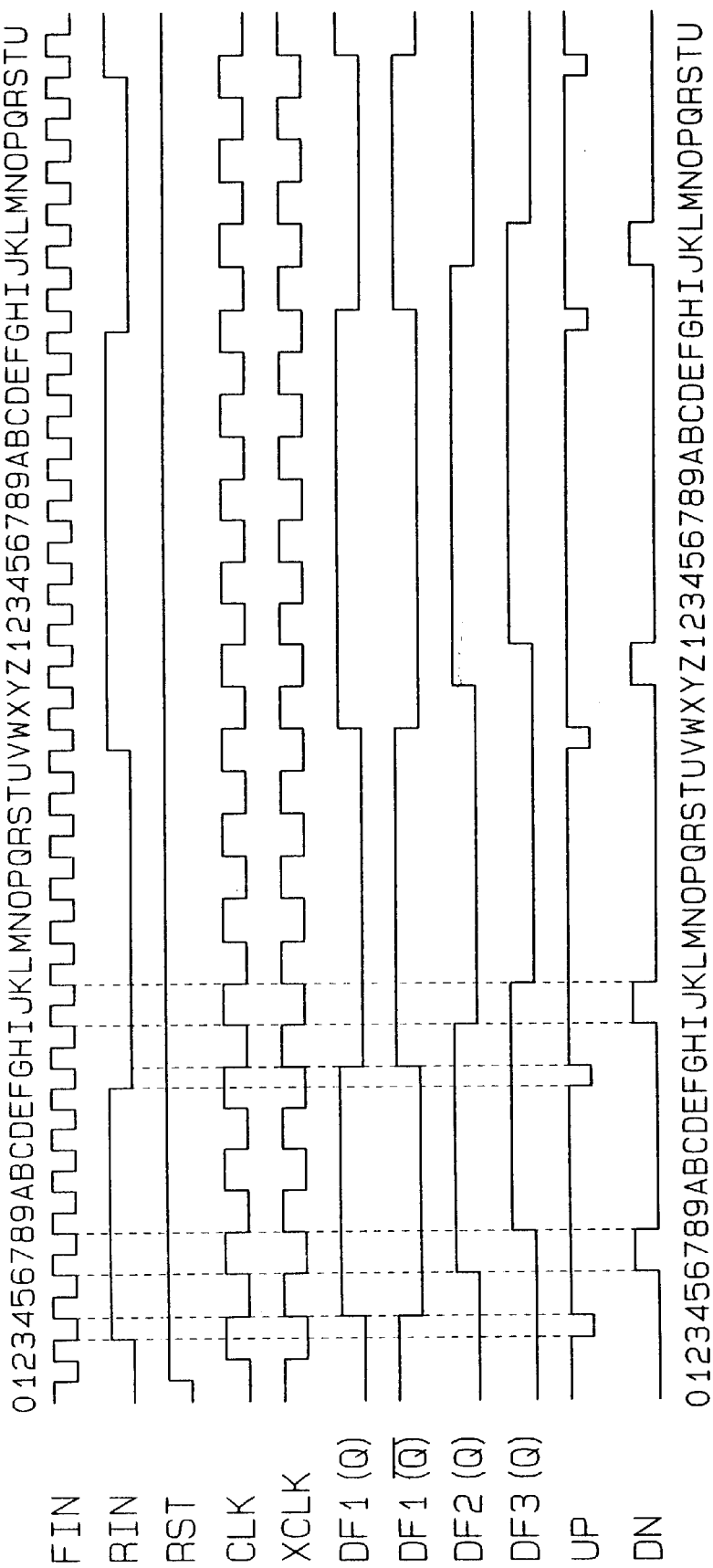
FIG. 6 is a timing chart for a case where the rising (falling) of the reference signal leads the rising of the clock by a half period in the phase comparator in FIG. 4.
Figure 7:
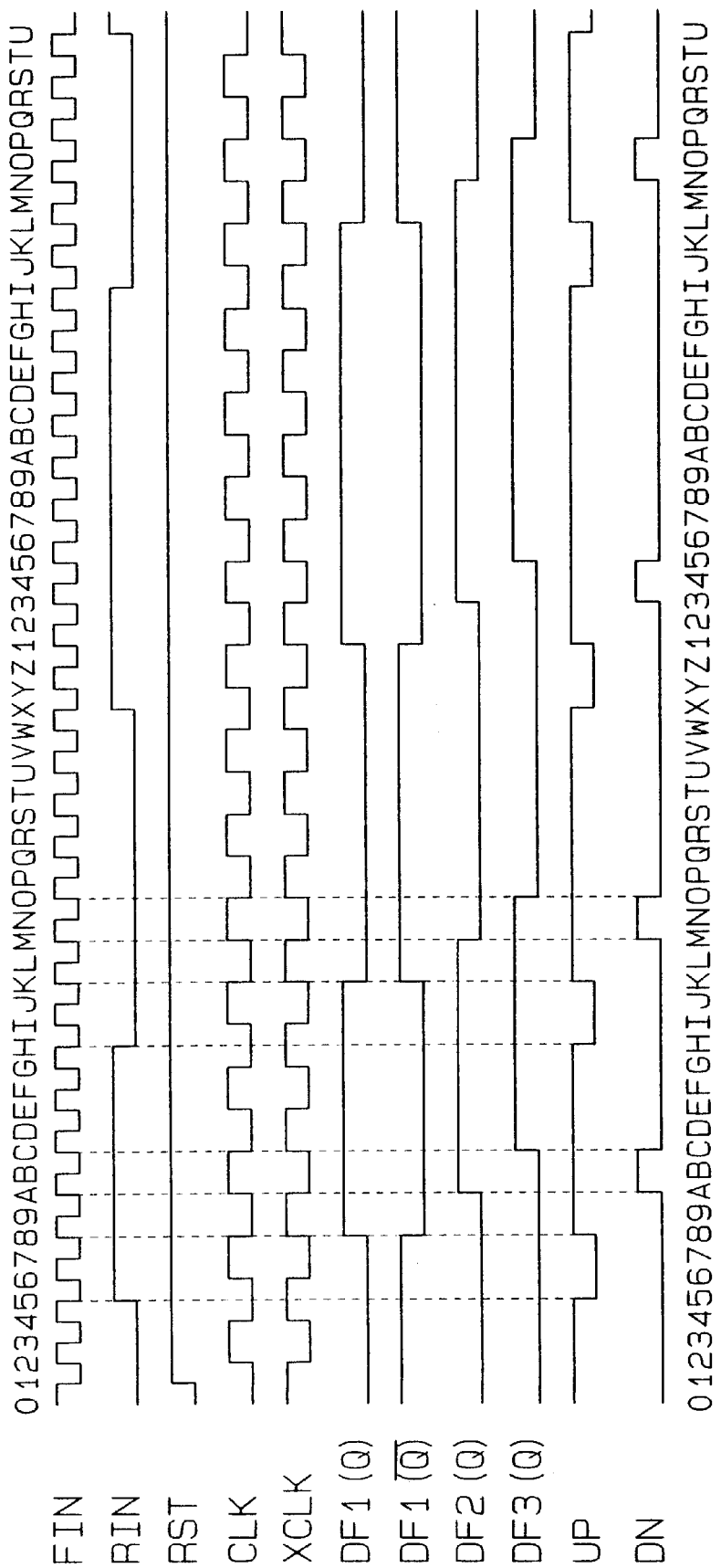
FIG. 7 is a timing chart for a case where the rising (falling) of the reference signal lags behind the rising of the clock by a half period in the phase comparator in FIG. 4.
Figure 8:
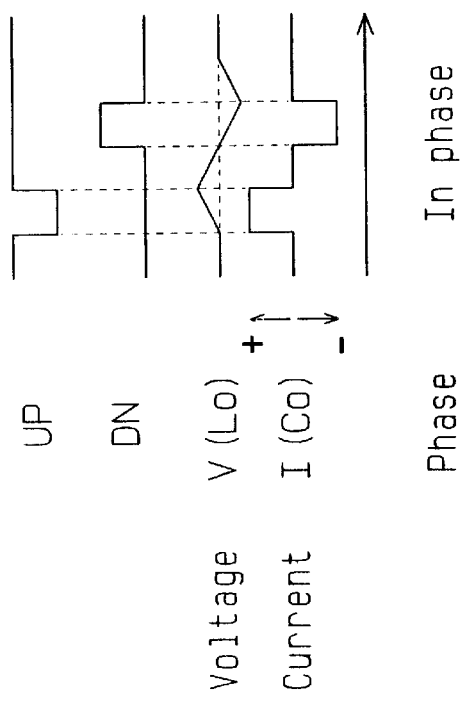
FIGS. 8(a) through 8(c) are waveform charts of the output signal of the phase comparator in FIG. 4 and the pump-up and pump-out currents of the charge pump in FIG. 2.
Figure 9:
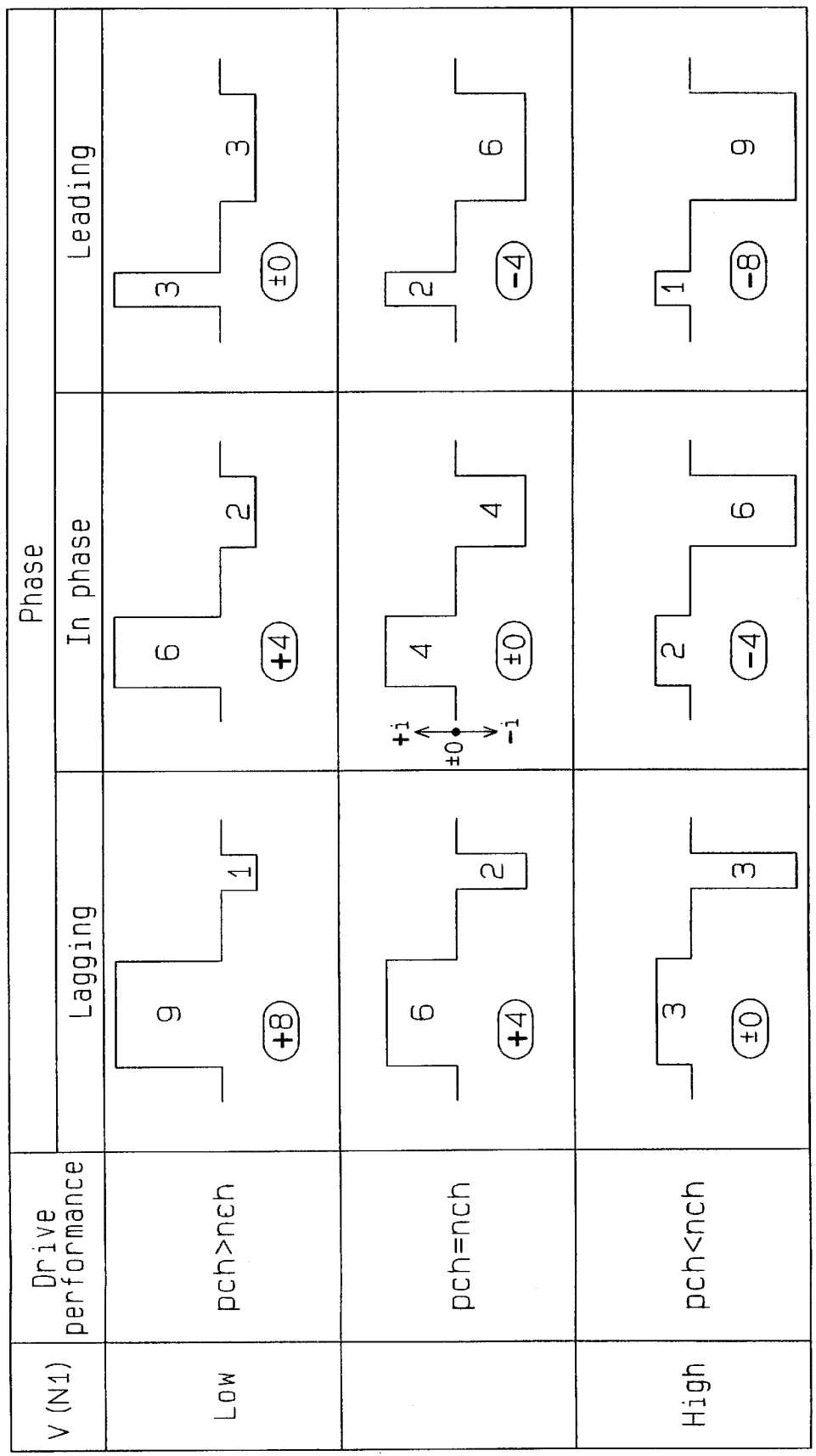
FIG. 9 is a matrix diagram showing the ratios of the charge amount to the discharge amount in the charge pump in FIG. 2 based on the relationship between the output voltage and the phase difference between the reference signal and the frequency-divided signal.
Figure 12:
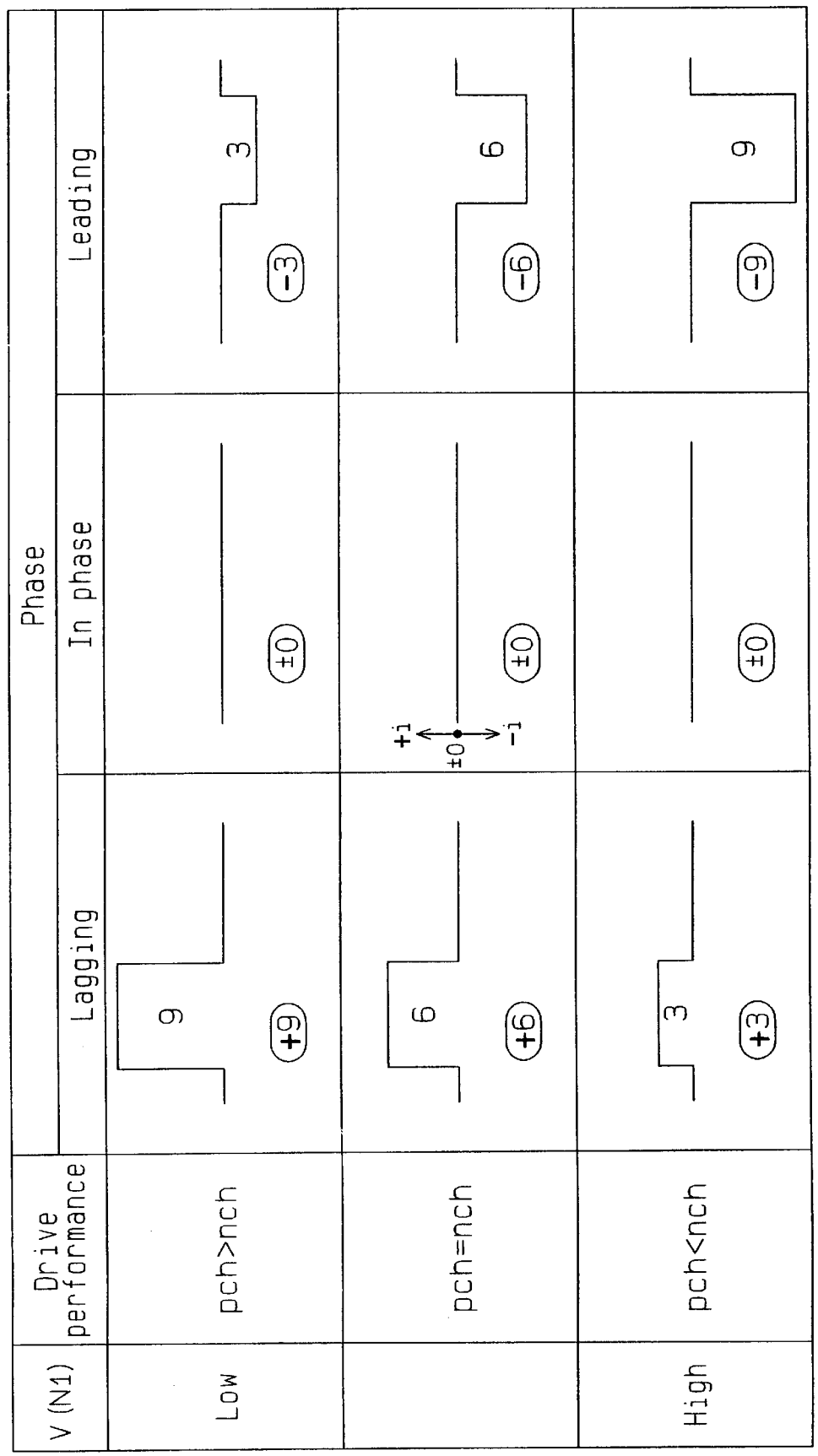
FIG. 12 is a matrix diagram showing the charge amounts and the discharge amounts in the charge pump in FIG. 2 which operates in accordance with the phase comparator in FIG. 10, based on the relationship between the output voltage and the phase difference between the reference signal and the frequency-divided signal.

When the reference signal RIN is in phase with the frequency-divided signal FIN, therefore, the charge pump 41 operates in such a way as to make the charge amount substantially equal to the discharge amount in response to the first and second phase difference signals UP and DN which have the same pulse width (the case shown at the center in FIG. 9). The corresponding prior art is the upper center in FIG. 9. As a result, the LPF 13 outputs the output signal Lo having a given voltage V(Lo) and the VCO 14 stably maintains the frequency of the oscillation output signal Fout locked in accordance with the output signal Lo.

When the phase of the frequency-divided signal FIN lags behind the phase of the reference signal RIN, the charge pump 41 operates to acquire the proper charge amount/discharge amount corresponding to the ratio of the long pulse width of the first phase difference signal UP to the short pulse width of the second phase difference signal DN (the left center in FIG. 9). The corresponding prior art is the upper left in FIG. 9. Accordingly, the LPF 13 properly increases the voltage V(Lo) of the output signal Lo and the VCO 14 increases the frequency of the oscillation output signal Fout, which locks the frequency of the oscillation output signal Fout to the target frequency.

When the phase of the frequency-divided signal FIN leads the phase of the reference signal RIN, the charge pump 41 operates to acquire the proper charge amount/discharge amount corresponding to the ratio of the short pulse width of the first phase difference signal UP to the long pulse width of the second phase difference signal DN (the right center in FIG. 9). The corresponding prior art is the upper right in FIG. 9. Accordingly, the LPF 13 properly decreases the voltage V(Lo) of the output signal Lo and the VCO 14 reduces the frequency of the oscillation output signal Fout, which locks the frequency of the oscillation output signal Fout to the target frequency.

As apparent from the above, the lockup time of the PLL circuit 40 is decreased without causing the frequency of the oscillation output signal Fout to go significantly beyond the target frequency.

In a third case, when the voltage V(N1) of the output signal Co is increased close to the voltage of the high-potential voltage supply $V_{DD}$, the voltage difference between the gate and source of the second PMOS transistor TP2 becomes greater than the voltage difference between the gate and source of the second NMOS transistor TN2. The detection circuit 43 therefore outputs the first and second divided voltages V1c and V2c lower than the predetermined first and second divided voltages V1a and V1b of the first case. As a result, the degree of conductivity of the first NMOS transistor TN1 becomes lower than that of the first PMOS transistor TP1. That is, the drive performance of the first PMOS transistor TP1 becomes greater, thus increasing the charge amount per unit time. Further, the drive performance of the first NMOS transistor TN1 becomes smaller, decreasing the discharge amount per unit time. Accordingly, the charge pump 41 compensates for the balance between the charge amount and the discharge amount while increasing the charge amount per unit time and decreasing the discharge amount per unit time.

When the reference signal RIN is in phase with the frequency-divided signal FIN, therefore, the charge pump 41 operates to make the charge amount substantially equal to the discharge amount in response to the first and second phase difference signals UP and DN which have the same pulse width (the case shown at the center in FIG. 9). The corresponding prior art is the lower center in FIG. 9. As a result, the LPF 13 outputs the output signal Lo having a predetermined voltage V(Lo).

When the phase of the frequency-divided signal FIN lags behind the phase of the reference signal RIN, the charge pump 41 performs the proper charge/discharge operation corresponding to the pulse widths of the first and second phase difference signals UP and DN (the left center in FIG. 9). The corresponding prior art is the lower left in FIG. 9. This increases the charge amount and the LPF 13 properly increases the voltage V(Lo) of the output signal Lo.

When the phase of the frequency-divided signal FIN leads the phase of the reference signal RIN, the charge pump 41 executes the proper charge/discharge operation corresponding to the pulse widths of the first and second phase difference signals UP and DN (the right center in FIG. 9). The corresponding prior art is the lower right in FIG. 9. This increases the discharge amount and the LPF 13 properly decreases the voltage V(Lo) of the output signal Lo.

As a modification of the first embodiment, an NMOS transistor may be connected between the node N3 and the first PMOS transistor TP1 and a PMOS transistor may be connected between the node N2 and the gate of the first NMOS transistor TN1 in FIG. 15. Alternatively, a transfer gate comprising a pair of a PMOS transistor and an NMOS transistor may be used. In these modifications, it is preferable to apply inverted signals of the first and second phase difference signals UP and DN to the gate of the PMOS transistor by means of an inverter circuit.

Figure 17:
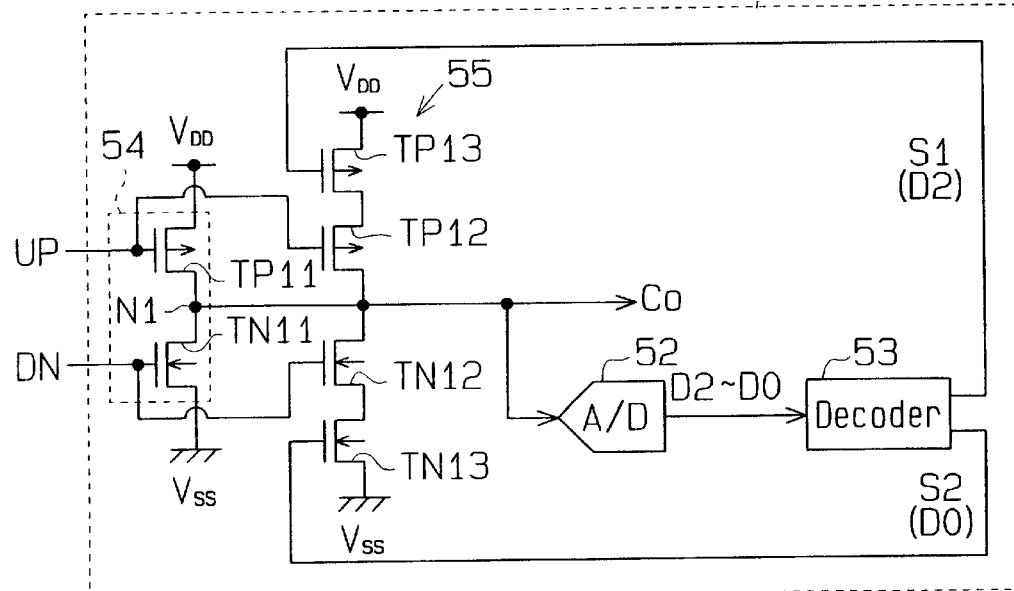
FIG. 17 is a circuit diagram of a charge pump according to a second embodiment of the invention.

FIG. 17 is a block circuit diagram of a charge pump 51 according to a second embodiment of the invention. The charge pump 51 includes first to third PMOS transistors TP11 to TP13, first to third NMOS transistors TN11 to TN13, an A/D (Analog-to-Digital) converter 52 and a decoder 53.

The first PMOS transistor TP11 and the first NMOS transistor TN11 form a series circuit, which serves as a first charge/discharge (C/D) circuit 54 that performs charging/discharging of the LPF 13. Specifically, the first PMOS transistor TP11 has a source connected to the high-potential voltage supply $V_{DD}$, a drain connected to the drain of the first NMOS transistor TN11 and a gate for receiving the first phase difference signal UP from the phase comparator 11. The first NMOS transistor TN11 has a source connected to the low-potential voltage supply $V_{SS}$ and a gate for receiving the second phase difference signal DN from the phase comparator 11.

Connected in parallel to the first PMOS transistor TP11 are the series-connected second and third PMOS transistors TP12 and TP13. That is, the second transistor TP12 has a drain connected to the node N1, a source connected to the third transistor TP13, and a gate for receiving the first phase difference signal UP. In response to the first phase difference signal UP, therefore, the second PMOS transistor TP12 is turned on or off at the same time as the first PMOS transistor TP11. The third transistor TP13 has a source connected to the high-potential voltage supply $V_{DD}$ and a gate for receiving a first control signal S1 (to be described later) which is output from the decoder 53. The third PMOS transistor TP13 is turned on or off in response to the first control signal S1. When the second and third PMOS transistors TP12 and TP13 are turned on substantially simultaneously, the current I(Co) is supplied to the LPF 13 from the high-potential voltage supply $V_{DD}$ via the second and third transistors TP12 and TP13.

The second and third PMOS transistors TP12 and TP13 and the second and third NMOS transistors TN12 and TN13 form a second C/D circuit 55 which performs charging/discharging of the LPF 13. The second and third PMOS transistors TP12 and TP13 form a pump-out circuit which pumps out the current to the LPF 13, while the second and third NMOS transistors TN12 and TN13 form a pump-up circuit which pumps up the current from the LPF 13.

Specifically, the series-connected second and third NMOS transistors TN12 and TN13 are connected in parallel to the first NMOS transistor TN11. That is, the second transistor TN12 has a drain connected to the node N1, a source connected to the drain of the third transistor TN13 and a gate for receiving the second phase difference signal DN. The second NMOS transistor TN12 is thus turned on or off at substantially the same time as the first NMOS transistor TN11 in response to the second phase difference signal DN. The third transistor TN13 has a source connected to the low-potential voltage supply $V_{SS}$, and a gate for receiving a second control signal S2 output from the decoder 53. The third NMOS transistor TN13 is turned on or off in response to the second control signal S2. When the second and third NMOS transistors TN12 and TN13 are turned on substantially simultaneously, the current I(Co) flows to the low-potential voltage supply $V_{SS}$ from the LPF 13 via the second and third transistors TN12 and TN13.

Figure 19:
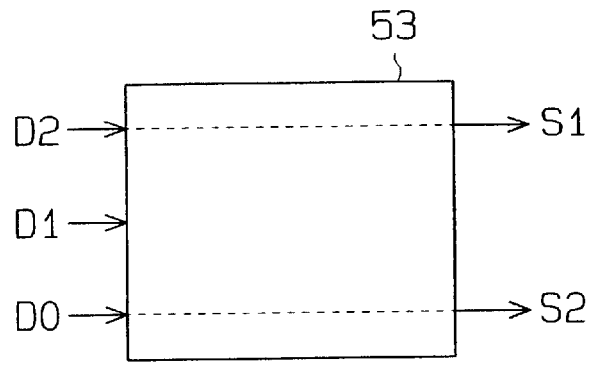
FIG. 19 is a circuit diagram of a decoder of the charge pump in FIG. 17.

The A/D converter 52, connected to the node N1, receives the output signal Co and generates bit signals D2 to D0. As shown in FIG. 19, the decoder 53 receives the bit signals D2–D0 from the A/D converter 52 and generates the first and second control signals S1 and S2 from the bit signals D2–D0. That is, the A/D converter 52 and the decoder 53 form a detection circuit which detects whether the voltage of the output signal Co is increased close to the voltage of the high-potential voltage supply $V_{DD}$ or decreased close to the voltage of the low-potential voltage supply $V_{SS}$ and outputs the first and second control signals S1 and S2 indicating the detection result.

Figure 18:
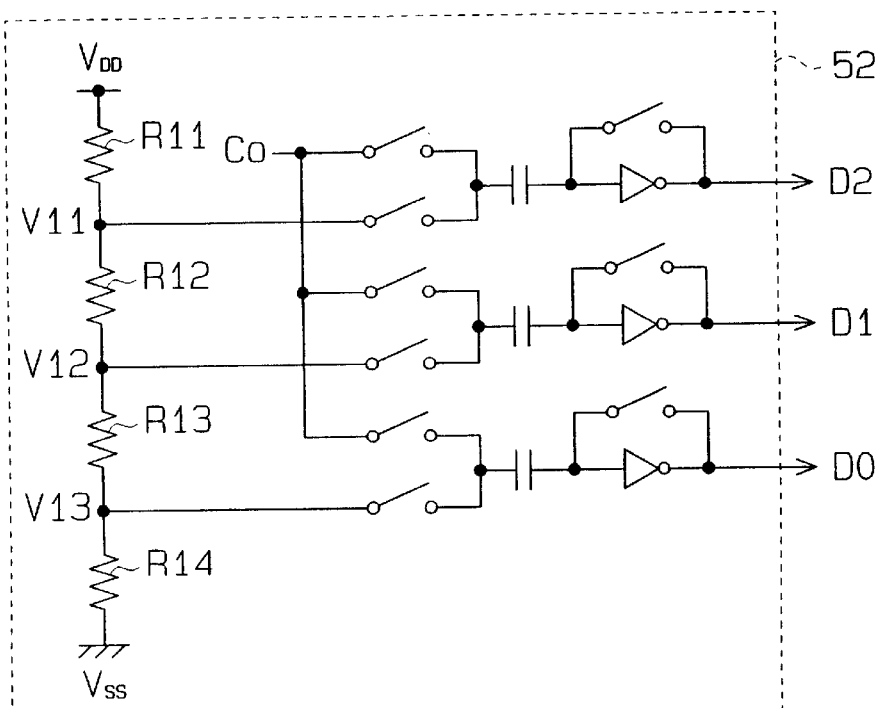
FIG. 18 is a circuit diagram of an A/D converter of the charge pump in FIG. 17.

As shown in FIG. 18, the A/D converter 52 preferably includes four resistors R11 to R14 connected in series between the high-potential voltage supply $V_{DD}$ and the low-potential voltage supply $V_{SS}$. The resistors R11–R14 form a frequency divider which generates first to third divided voltages V11 to V13 acquired by dividing the voltage between the high-potential voltage supply $V_{DD}$ and the low-potential voltage supply $V_{SS}$ in accordance with the resistances of the resistors R11–R14.

The A/D converter 52 compares the first to third divided voltages V11 to V13 with the voltage V(Co) of the output signal Co and generates the bit signals D2–D0 of three bits representing the comparison result. Specifically, with the voltage of the output signal Co present between the voltage of the high-potential voltage supply $V_{DD}$ and the first divided voltage V11, the A/D converter 52 outputs the bit signals D2–D0 of "000". When the voltage of the output signal Co lies between the first divided voltage V11 and the second divided voltage V12, the A/D converter 52 outputs the bit signals D2–D0 of "100". When the voltage of the output signal Co lies between the second divided voltage V12 and the third divided voltage V13, the A/D converter 52 outputs the bit signals D2–D0 of "110". When the voltage of the output signal Co lies between the third divided voltage V13 and the voltage of the low-potential voltage supply $V_{SS}$, the A/D converter 52 outputs the bit signals D2–D0 of "111". Thus, the bit signal D2 of "0" indicates that the voltage of the output signal Co is close to the voltage of the high-potential voltage supply $V_{DD}$. The bit signal D0 of "1" indicates that the voltage of the output signal Co is decreased close to the voltage of the low-potential voltage supply $V_{SS}$.

The third PMOS transistor TP13 is turned on in response to the first control signal S1 indicating that the voltage of the output signal Co is increased close to the voltage of the high-potential voltage supply $V_{DD}$. The third NMOS transistor TN13 is turned on in response to the second control signal S2 indicating that the voltage of the output signal Co is decreased close to the voltage of the low-potential voltage supply $V_{SS}$.

The operation of the charge pump 51 will be discussed below.

In a first case, when the voltage of the output signal Co lies between the first divided voltage V11 and the second divided voltage V12 or between the second divided voltage V12 and the third divided voltage V13, the A/D converter 52 outputs the bit signals D2–D0 of "110" or "100". The decoder 53 generates the H-level first control signal S1 and the L-level second control signal S2 from the bit signals D2–D0. The third transistors TP13 and TN13 are turned off in response to the first and second control signals S1 and S2. Accordingly, the second C/D circuit 55 does not operate. The first C/D circuit 54 performs a charge/discharge operation in response to the first and second phase difference signals UP and DN and outputs the output signal Co having a given voltage. At this time, the charge amount is substantially equal to the discharge amount.

In a second case, when the voltage of the output signal Co lies between the voltage of the high-potential voltage supply $V_{DD}$ and the first divided voltage V11, the A/D converter 52 outputs the bit signals D2–D0 of "000". The decoder 53 generates the L-level first and second control signals S1 and S2 from the bit signals D2–D0. The third PMOS transistor TP13 is turned on in response to the L-level first control signal S1, and the third NMOS transistor TN13 is turned off in response to the L-level second control signal S2. Accordingly, the first and second C/D circuits 54 and 55 carry out a charge operation, and the first C/D circuit 54 alone performs a discharge operation. When the voltage of the output signal Co is increased close to the voltage of the high-potential voltage supply $V_{DD}$, therefore, the drive performance of the pump-out circuit (charge circuit) is enhanced or accelerate, increasing the charge amount. That is, the charge operation of the second C/D circuit 55 compensates for the balance between the charge amount and the discharge amount.

In a third case, when the voltage of the output signal Co lies between the third divided voltage V13 and the voltage of the low-potential voltage supply $V_{SS}$ the A/D converter 52 outputs the bit signals D2–D0 of "111". The decoder 53 generates the H-level first and second control signals S1 and S2 from the bit signals D2–D0. The third PMOS transistor TP13 is turned off in response to the H-level first control signal S1, and the third NMOS transistor TN13 is turned on in response to the H-level second control signal S2. Accordingly, the first C/D circuit 54 alone performs a charge operation, and the first and second C/D circuits 54 and 55 carry out a discharge operation. When the voltage of the output signal Co is decreased close to the voltage of the low-potential voltage supply $V_{SS}$, therefore, the drive performance of the pump-up circuit (discharge circuit) is enhanced, increasing the discharge amount. That is, the discharge operation of the second C/D circuit 55 compensates for the balance between the charge amount and the discharge amount.

Figure 20:
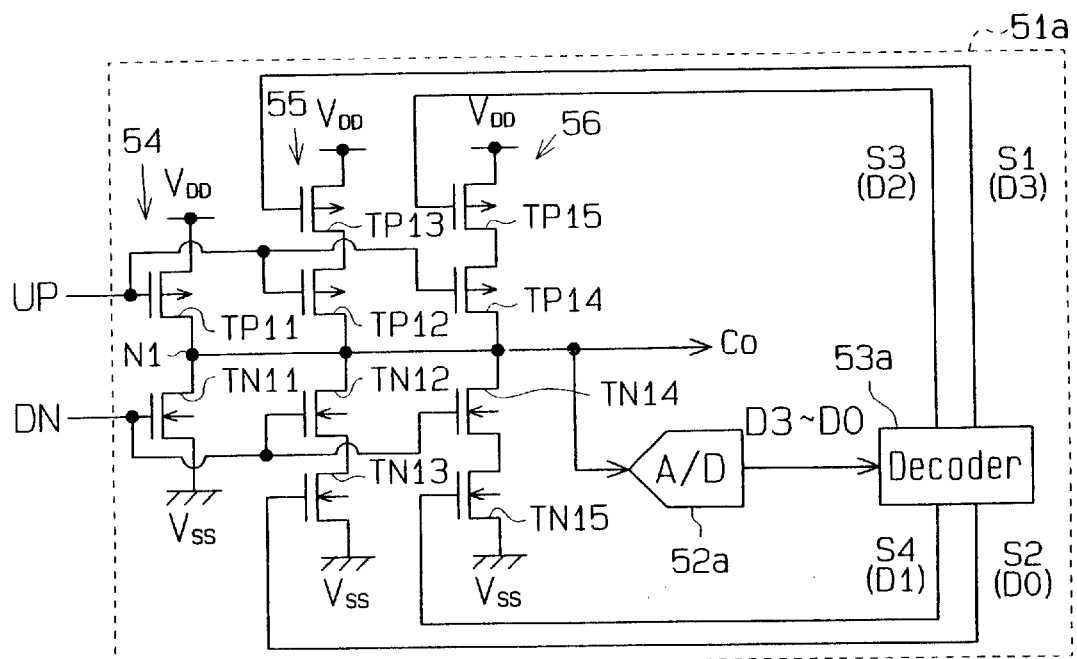
FIG. 20 is a circuit diagram of a charge pump according to a third embodiment of the invention.

FIG. 20 is a block circuit diagram of a charge pump 51a according to a third embodiment of the invention. The charge pump 51a includes first to fifth PMOS transistors TP11 to TP15, first to fifth NMOS transistors TN11 to TN15, an A/D converter 52a and a decoder 53a.

The first PMOS transistor TP11 and the first NMOS transistor TN11 form a first C/D circuit 54. The second and third PMOS transistors TP12 and TP13 and the second and third NMOS transistors TN12 and TN13 form a second C/D circuit 55. The operations of the first and second C/D circuits 54 and 55 are the same as those of the second embodiment in FIG. 17. The fourth and fifth PMOS transistors TP14 and TP15 and the fourth and fifth NMOS transistors TN14 and TN15 form a third C/D circuit 56.

The series-connected fourth and fifth PMOS transistors TP14 and TP15 are connected in parallel to the first PMOS transistor TP11. Specifically, the fourth transistor TP14 has a drain connected to the node N1, a source connected to the drain of the fifth transistor TP15 and a gate for receiving the first phase difference signal UP. The fourth PMOS transistor TP14 is turned on or off in response to the first phase difference signal UP at the same time as the first PMOS transistor TP11. The fifth transistor TP15 has a source applied with the voltage of the high-potential voltage supply $V_{DD}$ and a gate for receiving the first control signal S3 from the decoder 53a to be described later. The fifth PMOS transistor TP15 is turned on or off in response to the first control signal S3. When the fourth and fifth PMOS transistors TP14 and TP15 are turned on substantially simultaneously, the current I(Co) is supplied to the LPF 13 from the high-potential voltage supply $V_{DD}$ via the fourth and fifth transistors TP14 and TP15.

The series-connected fourth and fifth NMOS transistors TN14 and TN15 are connected in parallel to the first NMOS transistor TN1. Specifically, the fourth transistor TN14 has a drain connected to the node N1, a source connected to the drain of the fifth transistor TN15 and a gate to which the fourth phase difference signal DN is input. In response to the fourth phase difference signal DN, therefore, the fourth NMOS transistor TN14 is turned on or off at the same time as the first NMOS transistor TN11. The fifth transistor TN15 has a source to be applied with the voltage of the low-potential voltage supply $V_{SS}$ and a gate for receiving the fourth control signal S4 output from the decoder 53a. The fifth NMOS transistor TN15 is turned on or off in response to the fourth control signal S4. As the fourth and fifth NMOS transistors TN14 and TN15 are turned on simultaneously, the current I(Co) flows to the low-potential voltage supply $V_{SS}$ from the LPF 13 via the fourth and fifth transistors TN14 and TN15.

Figure 22:
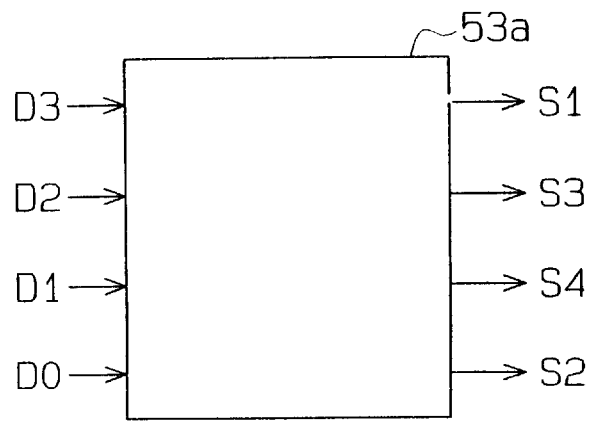
FIG. 22 is a block diagram of a decoder of the charge pump in FIG. 20.

The A/D converter 52a, connected to the node N1, receives the output signal Co and generates bit signals D3 to D0 of four bits. As shown in FIG. 22, the decoder 53a shown in FIG. 22 receives the bit signals D3–D0 from the A/D converter 52a and generates the first to fourth control signals S1 to S4 from the bit signals D3–D0. That is, the A/D converter 52a and the decoder 53a form a detection circuit which detects whether the voltage of the output signal Co is increased close to the voltage of the high-potential voltage supply $V_{DD}$ or the voltage of the low-potential voltage supply $V_{SS}$ and outputs the first to fourth control signals S1–S4 representing the detection result.

Figure 21:
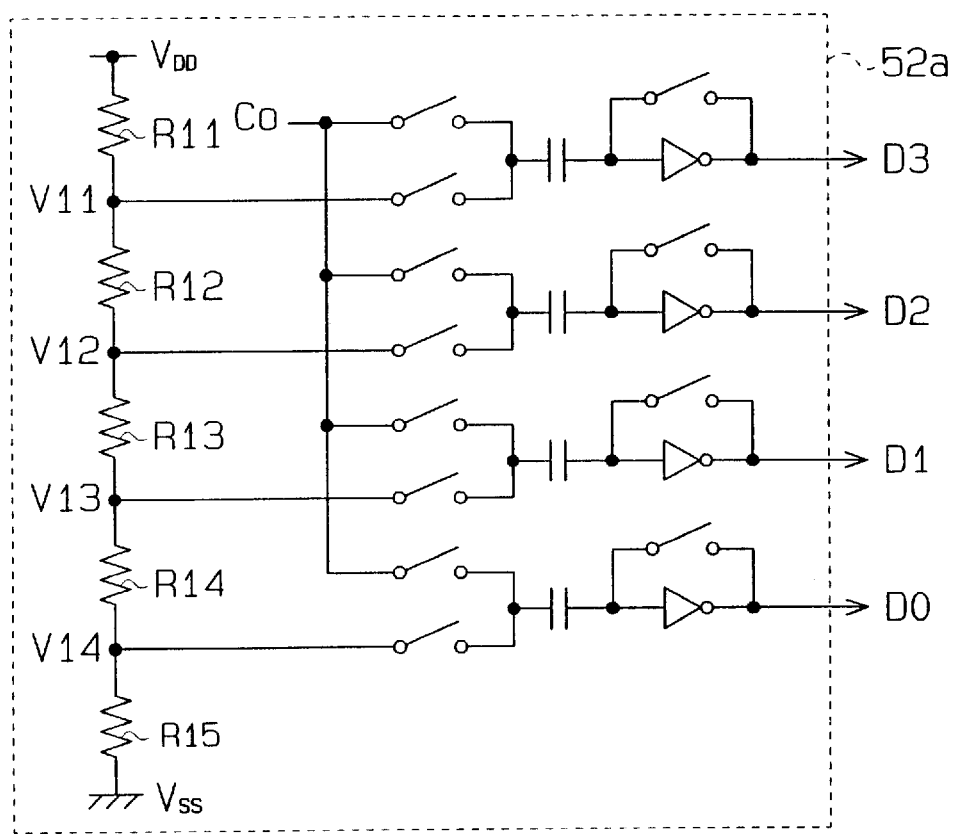
FIG. 21 is a circuit diagram of an A/D converter of the charge pump in FIG. 20.

As shown in FIG. 21, the A/D converter 52a includes five resistors R11 to R15 connected in series between the high-potential voltage supply $V_{DD}$ and the low-potential voltage supply $V_{SS}$. The resistors R11–R15 form a frequency divider which generates first to fourth divided voltages V11 to V14 acquired by dividing the voltage between the high-potential voltage supply $V_{DD}$ and the low-potential voltage supply $V_{SS}$ in accordance with the resistances of the resistors R11–R15.

The A/D converter 52a compares the first to third divided voltages V11–V14 with the voltage V(Co) of the output signal Co and generates the bit signals D3–D0 of fourth bits representing the comparison result. Specifically, with the voltage of the output signal Co lying between the voltage of the high-potential voltage supply $V_{DD}$ and the first divided voltage V11, the A/D converter 52a outputs the bit signals D2–D0 of "0000". When the voltage of the output signal Co lies between the first divided voltage V11 and the second divided voltage V12, the A/D converter 52a outputs the bit signals D2–D0 of "1000". When the voltage of the output signal Co lies between the second divided voltage V12 and the third divided voltage V13, the A/D converter 52a outputs the bit signals D2–D0 of "1100". When the voltage of the output signal Co lies between the third divided voltage V13 and the fourth divided voltage V14, the A/D converter 52a outputs the bit signals D2–D0 of "1110". When the voltage of the output signal Co lies between the fourth divided voltage V14 and the voltage of the low-potential voltage supply $V_{SS}$, the A/D converter 52a outputs the bit signals D2–D0 of "1111".

The bit signal D3 is "0" when the voltage V(Co) of the output signal Co lies between the voltage of the high-potential voltage supply $V_{DD}$ and the first divided voltage V11, and is "1" when the voltage V(Co) of the output signal Co lies between the voltage of the first divided voltage V11 and the voltage of the low-potential voltage supply $V_{SS}$. The bit signal D2 or the first control signal S1 therefore indicates that the voltage of the output signal Co lies between the voltage of the high-potential voltage supply $V_{DD}$ and the first divided voltage V11.

The bit signal D2 of "0" indicates that the voltage of the output signal Co lies between the voltage of the high-potential voltage supply $V_{DD}$ and the second divided voltage V12. The bit signal D1 of "1" indicates that the voltage of the output signal Co lies between the third divided voltage V13 and the voltage of the low-potential voltage supply $V_{SS}$. The bit signal D0 of "1" indicates that the voltage of the output signal Co lies between the fourth divided voltage V14 and the voltage of the low-potential voltage supply $V_{SS}$.

The third PMOS transistor TP13 is turned on in response to the L-level first control signal S1. The third NMOS transistor TN13 is turned on in response to the H-level second control signal S2. The fifth PMOS transistor TP15 is turned on in response to the L-level third control signal S3. The fifth NMOS transistor TN15 is turned on in response to the H-level fourth control signal S4.

The operation of the charge pump 51a will be discussed below.

In a first case, when the voltage of the output signal Co lies between the second divided voltage V12 and the third divided voltage V13, the A/D converter 52a outputs the bit signals D3–D0 of "1100". The decoder 53 generates the H-level first and third control signals S1 and S3 and the L-level second and fourth control signals S2 and S4 from the bit signals D3–D0. The third transistors TP13 and TN13 are turned off in response to the first to fourth control signals S1 to S4. Accordingly, the second and third C/D circuits 55 and 56 do not operate. The first C/D circuit 54 performs a charge/discharge operation and outputs the output signal Co having a given voltage. At this time, the charge amount is substantially equal to the discharge amount.

In a second case, when the voltage of the output signal Co lies between the first divided voltage V11 and the second divided voltage V12, the A/D converter 52a outputs the bit signals D3–D0 of "1000". The decoder 53 generates the H-level first control signal S1 and the L-level second to fourth control signals S2 to S4 from the bit signals D3-D0. The third PMOS transistor TP13 is turned off in response to the H-level first control signal S1, and the fifth PMOS transistor TP15 is turned on in response to the L-level third control signal S3. The third and fifth NMOS transistors TN13 and TN15 are turned off in response to the L-level second and fourth control signals S2 and S4. Accordingly, the second C/D circuit 55 does not operate, the first and third C/D circuits 54 and 56 carry out a charge operation, and the first C/D circuit 54 alone executes a discharge operation. That is, the low drive performance of the first PMOS transistor TP11 is compensated for by the fifth PMOS transistor TP15, thus increasing the charge amount. When the voltage of the output signal Co is increased close to the voltage of the high-potential voltage supply $V_{DD}$, therefore, the drive performance of the pump-out circuit (charge circuit) is enhanced, increasing the charge amount. That is, the charge operation of the third C/D circuit 56 compensates for the balance between the charge amount and the discharge amount.

In a third case, when the voltage of the output signal Co lies between the voltage of the high-potential voltage supply $V_{DD}$ and the first divided voltage V11, the A/D converter 52a outputs the bit signals D3–D0 of "0000". The decoder 53 generates the L-level first to fourth control signals S1 to S4 from the bit signals D3–D0. The third and fifth PMOS transistors TP13 and TP15 are turned on in response to the L-level first and third control signals S1 and S3, and the third and fifth NMOS transistors TN13 and TN15 are turned off in response to the L-level second and fourth control signals S2 and S4. Accordingly, the first to third C/D circuits 54 to 56 perform a charge operation, and the first C/D circuit 54 alone carries out a discharge operation. That is, the lower drive performance of the first PMOS transistor TP11 is compensated for by the third and fifth PMOS transistors TP13 and TP15, thus increasing the charge amount. When the voltage of the output signal Co is increased close to the voltage of the high-potential voltage supply $V_{DD}$, therefore, the drive performance of the pump-out circuit (charge circuit) is enhanced, making the charge amount greater than that in the second case.

In a fourth case, when the voltage of the output signal Co lies between the third divided voltage V13 and the fourth divided voltage V14, the A/D converter 52a outputs the bit signals D3–D0 of "1110". The decoder 53 generates the H-level first, third and fourth control signals S1, S3 and S4 and the L-level second control signal S2 from the bit signals D3–D0. The third and fifth PMOS transistors TP13 and TP15 are turned off in response to the H-level first control signal S1. The third NMOS transistor TN13 is turned off in response to the L-level second control signal S2. The fifth NMOS transistor TN15 is turned on in response to the H-level fourth control signal S4. Accordingly, the second C/D circuit 55 does not operate. The first C/D circuit 54 performs a charge operation, and the first and third C/D circuits 54 and 56 carry out a discharge operation. When the voltage of the output signal Co is decreased close to the voltage of the low-potential voltage supply $V_{SS}$, therefore, the drive performance of the pump-up circuit (discharge circuit) is enhanced, increasing the discharge amount. That is, the low drive performance of the first NMOS transistor TN11 is compensated for by the fifth NMOS transistor TN15, thus increasing the discharge amount.

In a fifth case, when the voltage of the output signal Co lies between the fourth divided voltage V14 and the voltage of the low-potential voltage supply $V_{SS}$, the A/D converter 52a outputs the bit signals D3–D0 of "1111". The decoder 53 generates the H-level first to fourth control signals S1 to S4 from the bit signals D3–D0. The third and fifth PMOS transistors TP13 and TP15 are turned off in response to the H-level first and third control signals S1 and S3. The third and fifth NMOS transistors TN13 and TN15 are turned on in response to the H-level second and fourth control signals S2 and S4. Accordingly, the first C/D circuit 54 performs a charge operation, and the first to third C/D circuits 54 to 56 carry out a discharge operation. When the voltage of the output signal Co is decreased close to the voltage of the low-potential voltage supply $V_{SS}$, therefore, the drive performance of the pump-up circuit (discharge circuit) is enhanced, increasing the discharge amount. That is, the low drive performance of the first NMOS transistor TN11 is compensated for by the third and fifth NMOS transistors TN13 and TN15.

Figure 23:
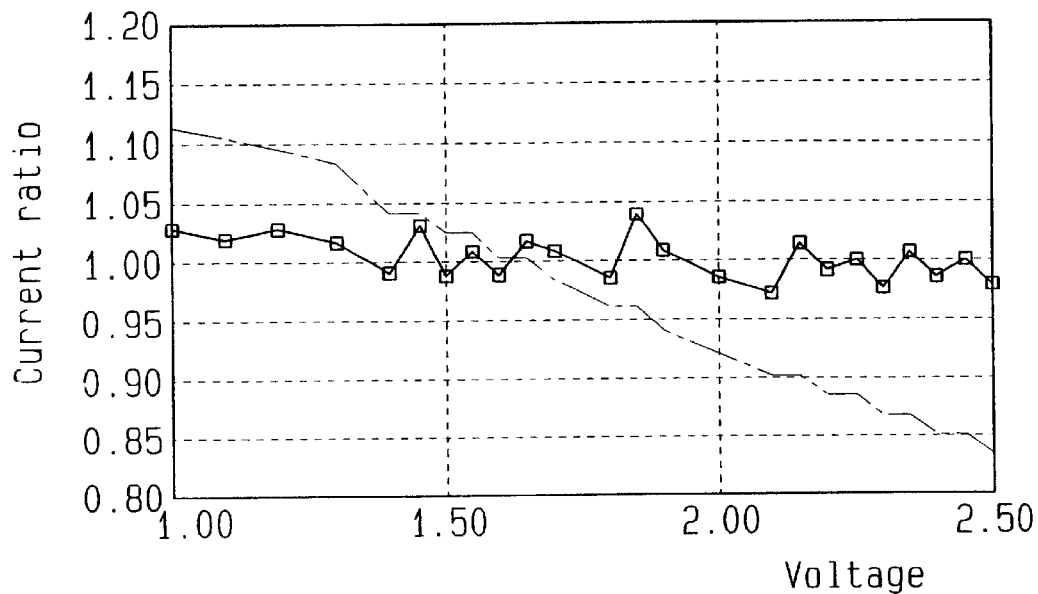
FIG. 23 is a characteristic diagram of the charge pump in FIG. 20.

FIG. 23 presents a graph showing the relationship between the charge/discharge current ratio and the voltage of the output signal Co with respect to the first and second phase difference signal UP and DN. In FIG. 23, the solid line indicates the characteristic of the charge pump 51a, while the one-dot chain line indicates the characteristic of the conventional charge pump 12. It is apparent that the charge/discharge current ratio of the charge pump 51a of present invention is nearly "1" from the low-potential voltage supply $V_{SS}$ side (the left side of FIG. 23) to the high-potential voltage supply $V_{DD}$ side (the right side of FIG. 23). According to the conventional charge pump 12, the charge current is larger than the discharge current on the low-potential voltage supply $V_{SS}$ side (the left side of FIG. 23) while the charge current is smaller than the discharge current on the high-potential voltage supply $V_{DD}$ side (the right side of FIG. 23).

In the second and third embodiments, a microcomputer having the functions of the A/D converter 52 or 52a and the decoder 53 or 53a may be used. In the second and third embodiments, the decoder 53 or 53a may be omitted.

Figure 24:
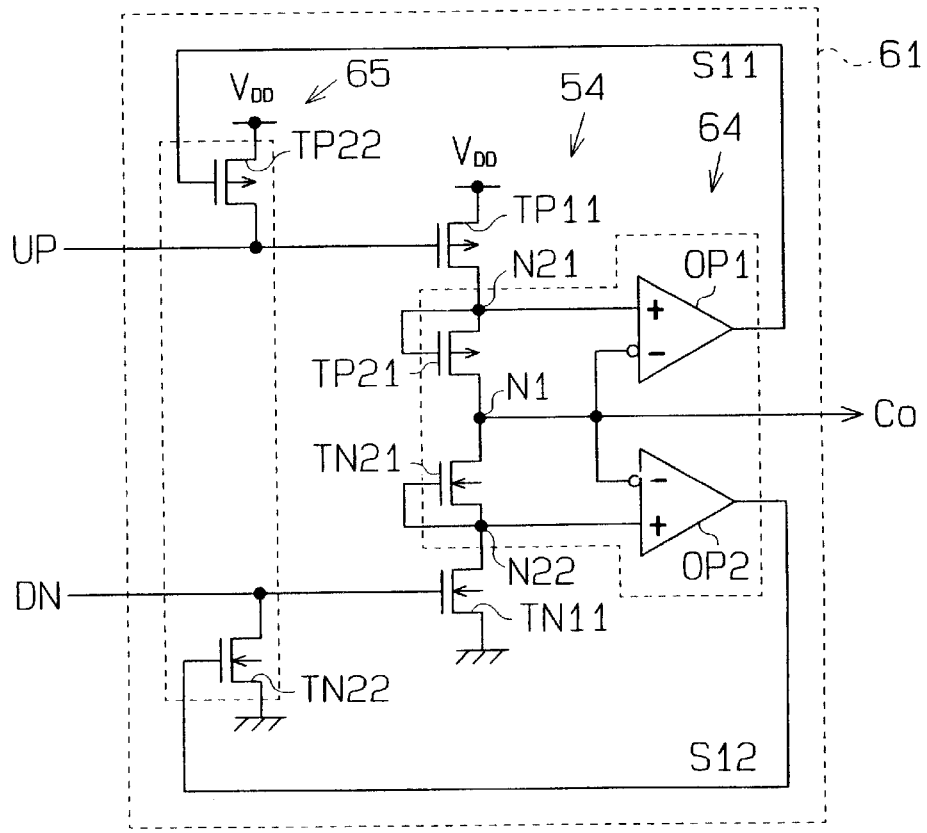
FIG. 24 is a circuit diagram of a charge pump according to a fourth embodiment of the invention.

FIG. 24 is a circuit diagram of a charge pump 61 according to a fourth embodiment of the invention. The charge pump 61 includes a C/D circuit 54, a detection circuit 64 and a compensation circuit 65. The C/D circuit 54 includes a pair of first PMOS and NMOS transistors TP11 and TN11. The detection circuit 64, which includes first and second operational amplifiers OP1 and OP2 and second PMOS and NMOS transistors TP21 and TN21, detects whether the voltage of the output signal Co is increased close to the voltage of the high-potential voltage supply $V_{DD}$ or the voltage of the low-potential voltage supply $V_{SS}$. The compensation circuit 63, which includes third PMOS and NMOS transistors TP22 and TN22, compensates for the charge amount/discharge amount of the C/D circuit 54.

The second PMOS transistor TP22 is connected between the first PMOS transistor TP11 and the node N1, and the second NMOS transistor TN22 is connected between the first NMOS transistor TN11 and the node N1. The second PMOS transistor TP21, which has a gate connected to its source, generates, across its source and drain, a differential voltage between the voltage V(N1) of the node N1 and the voltage of the high-potential voltage supply $V_{DD}$. The second NMOS transistor TN21, which has a gate connected to its source, generates, across its source and drain, a differential voltage between the voltage V(N1) of the node N1 and the voltage of the low-potential voltage supply $V_{SS}$.

The first operational amplifier OP1 has an inverting input terminal connected to the node N1, and a non-inverting input terminal connected to the node N21 between the first PMOS transistor TP11 and the second PMOS transistor TP21. The first operational amplifier OP1 sends the first control signal S1 having a predetermined voltage to the third PMOS transistor TP22 based on the voltage difference between the nodes N21 and N1. The voltage difference between the nodes N21 and N1 is associated with the voltage difference between the voltage of the output signal Co and the voltage of the high-potential voltage supply $V_{DD}$.

The second operational amplifier OP2 has an inverting input terminal connected to the node N1, and a non-inverting input terminal connected to the node N22 between the first NMOS transistor TN11 and the second NMOS transistor TN21. The second operational amplifier OP2 sends the second control signal S12 of a predetermined voltage to the third NMOS transistor TN22 based on the voltage difference between the nodes N22 and N1. The voltage difference between the nodes N22 and N1 is associated with the voltage difference between the voltage of the output signal Co and the voltage of the low-potential voltage supply $V_{SS}$.

The voltage of the output signal Co (node N1) is increased close to the voltage of the high-potential voltage supply $V_{DD}$, the voltage difference between both input terminals of the first operational amplifier OP1 is small while the voltage difference between both input terminals of the second operational amplifier OP2 is large. Accordingly, the first and second operational amplifiers OP1 and OP2 respectively output the first and second control signals S1 and S12 having high voltages. The smaller the voltage difference between both input terminals becomes, the higher (increased close to the voltage of the high-potential voltage supply $V_{DD}$) the voltage of the first control signal S11 output from the first operational amplifier OP1 gets. The greater the voltage difference between both input terminals becomes, the higher (increased close to the voltage of the high-potential voltage supply $V_{DD}$) the voltage of the second control signal S12 output from the second operational amplifier OP2 gets.

The voltage of the output signal Co (node N1) is decreased close to the voltage of the low-potential voltage supply $V_{SS}$, the voltage difference between both input terminals of the first operational amplifier OP1 is large while the voltage difference between both input terminals of the second operational amplifier OP2 is small. Accordingly, the first and second operational amplifiers OP1 and OP2 respectively output the first and second control signals S11 and S12 having low voltages. The greater the voltage difference between both input terminals becomes, the lower (decreased close to the voltage of the low-potential voltage supply $V_{SS}$) the voltage of the first control signal S11 output from the first operational amplifier OP1 gets. The smaller the voltage difference between both input terminals becomes, the lower (decreased close to the voltage of the low-potential voltage supply $V_{SS}$) the voltage of the second control signal S12 output from the second operational amplifier OP2 gets.

The third PMOS transistor TP22 has a source connected to the high-potential voltage supply $V_{DD}$, a drain connected to the gate of the first PMOS transistor TP11 and a gate for receiving the first control signal S11 from the first operational amplifier OP1. The third PMOS transistor TP22 has an ON resistance corresponding to the voltage of the first control signal S11 when turned on in response to the first control signal S11. When the third PMOS transistor TP22 has a small ON resistance, for example, charge is supplied through the third PMOS transistor TP22 from the high-potential voltage supply $V_{DD}$, raising the voltage level of the first phase difference signal UP. The first phase difference signal UP having the increased voltage is applied to the gate of the first PMOS transistor TP11, lowering the degree of conductivity of the first PMOS transistor TP11. This reduces the charge amount of the first PMOS transistor TP11.

The third NMOS transistor TN22 has a source connected to the low-potential voltage supply $V_{SS}$, a drain connected to the gate of the first NMOS transistor TN11 and a gate for receiving the second control signal S12 from the second operational amplifier OP2. The third NMOS transistor TN22 has an ON resistance corresponding to the voltage of the first control signal S11 when turned on in response to that second control signal S12. When the third NMOS transistor TN22 has a small ON resistance, for example, charge is supplied through the third NMOS transistor TN22 to the low-potential voltage supply $V_{SS}$, lowering the voltage level of the second phase difference signal DN. The second phase difference signal DN having the decreased voltage is applied to the gate of the first NMOS transistor TN11, lowering the degree of conductivity of the third NMOS transistor TN22. This reduces the discharge amount of the first NMOS transistor TN11.

When the voltage of the output signal Co is in the vicinity of the intermediate voltage ($\frac{1}{2}(V_{DD}+V_{SS})$) between the voltages of the high-potential voltage supply $V_{DD}$ and the low-potential voltage supply $V_{SS}$, the first and second operational amplifiers OP1 and OP2 respectively output the first and second control signals S11 and S12 which have such voltages as to make the charge amount of the first PMOS transistor TP11 substantially equal to the discharge amount of the first NMOS transistor TN22.

Figure 25:
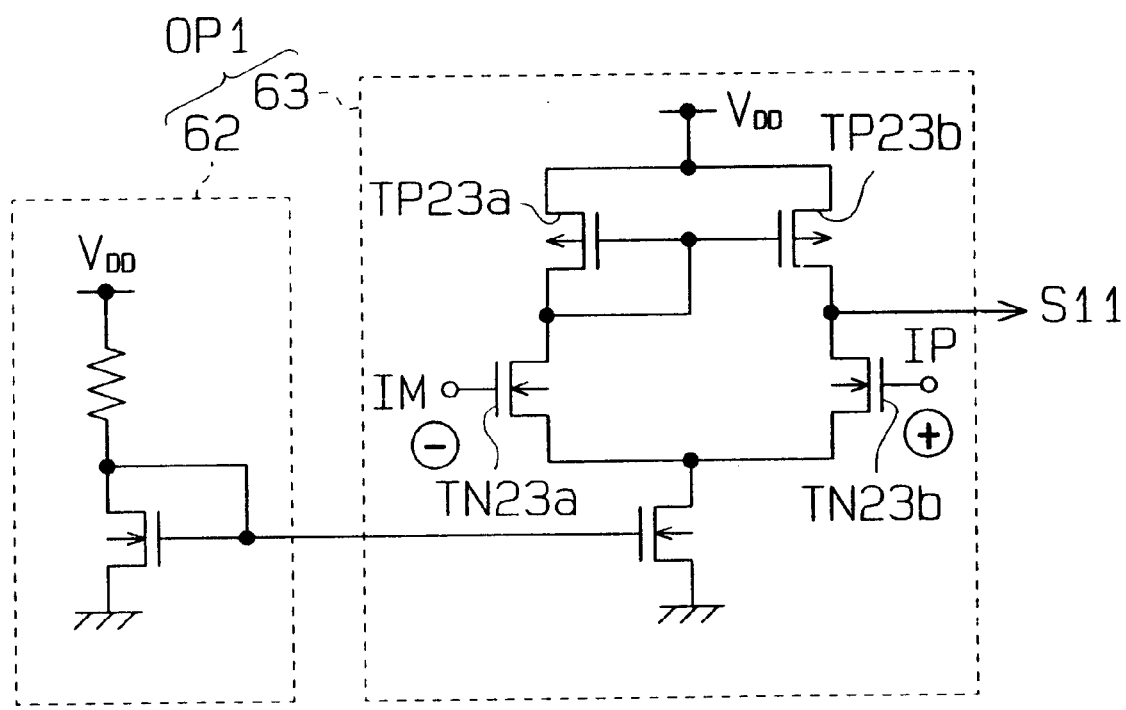
FIG. 25 is a circuit diagram of a differential amplifier of the charge pump in FIG. 24.

FIG. 25 is a circuit diagram of the first operational amplifier OP1. The operational amplifier OP1 includes a bias voltage generator 62 and a differential amplifier 63. The differential amplifier 63 increases the current flowing in an NMOS transistor TN23b by ΔI when the voltage of a signal IP input to the non-inverting input terminal is higher or increased by ΔV than the voltage of a signal IM input to the inverting input terminal. This increase in current reduces the current flowing in an NMOS transistor TN23a by ΔI and the current flowing in a PMOS transistor TP23b by ΔI. The differential amplifier 63 pumps up the current corresponding to the amount of current (2ΔI) variable at the PMOS transistor TP23b. As a result, the voltage of the first control signal S11 drops. When the voltage of the signal IM is higher or increased by ΔV than the voltage of the signal IP, on the other hand, the voltage of the first control signal S11 rises in accordance with the voltage difference ΔV. As the second operational amplifier OP2 has the same circuit constitution as the first operational amplifier OP1, its drawing and detailed description will be omitted.

The operation of the charge pump 61 will now be discussed.

Figure 26C:
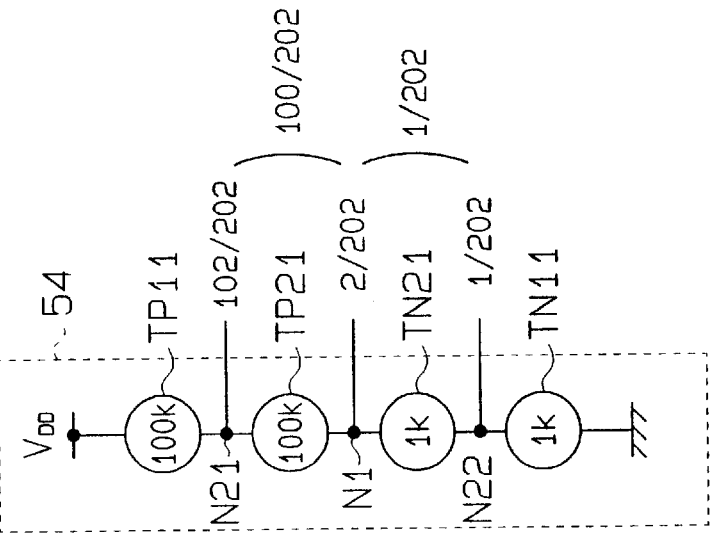
FIGS. 26(a) through 26(c) are diagrams showing changes in a resistor of the charge pump in FIG. 24.
Figure 26B:
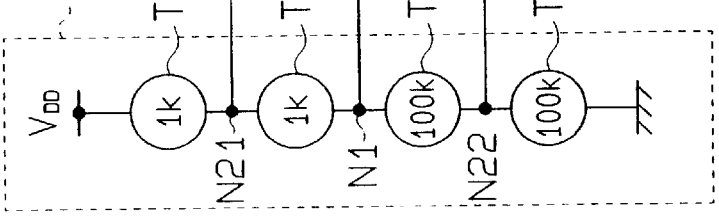
Figure 26A:
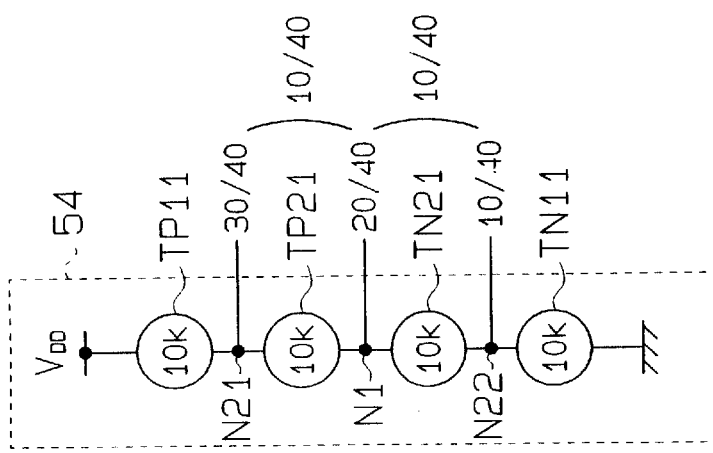

In a first case, when the voltage of the output signal Co lies between the voltage of the high-potential voltage supply $V_{DD}$ and the voltage of the low-potential voltage supply $V_{SS}$, as shown in FIG. 26(a), the first and second PMOS transistors TP11 and TP21 and the first and second NMOS transistors TN11 and TN21 have substantially the same resistance (e.g., each transistor has an ON resistance of about 10 Kohms in FIG. 26(a)). Thus, a voltage obtained by equally dividing the voltage difference between the high-potential voltage supply $V_{DD}$ and the low-potential voltage supply $V_{SS}$ by the ON resistances of the individual transistors is produced at the nodes N21, N1 and N22. The first and second operational amplifiers OP1 and OP2 respectively output the first and second control signals S11 and S12 indicating the intermediate voltage based on the voltages at the nodes N21, N1 and N22. The third PMOS and NMOS transistors TP22 and TN22 have the same ON resistance when they operate in response to the first and second control signals S11 and S12. As a result, the charge amount of the first PMOS transistor TP11 becomes substantially the same as the discharge amount of the NMOS transistor TN11.

In a second case, when the voltage V(N1) of the output signal Co is decreased close to the voltage of the low-potential voltage supply $V_{SS}$, as shown in FIG. 26(b), the ON resistances of the first and second PMOS transistors TP11 and TP21 become smaller while the ON resistances of the first and second NMOS transistors TN11 and TN21 get larger. This reduces the potential difference between the nodes N21 and N1 and increases the potential difference between the nodes N1 and N22.

The first operational amplifier OP1 outputs the first control signal S11 having a low voltage based on the potential difference between the nodes N21 and N1, and the second operational amplifier OP2 outputs the second control signal S12 having a low voltage based on the potential difference between the nodes N1 and N22.

The third PMOS transistor TP22 is turned on at a high degree of conductivity in response to the first control signal S11 of a low voltage. This increases the voltage level of the first phase difference signal UP, reducing the degree of conductivity of the first PMOS transistor TP11. Consequently, the charge amount of the first PMOS transistor TP11 gets smaller. The third NMOS transistor TN22 is turned off in response to the second control signal S12 of a low voltage. Accordingly, the first NMOS transistor TN11 performs a discharge operation at a high degree of conductivity in response to the H-level second phase difference signal DN. In this way, the charge amount per unit time is reduced to compensate for the balance between the charge amount and the discharge amount.

In a third case, when the voltage V(N1) of the output signal Co is increased close to the voltage of the high-potential voltage supply $V_{DD}$, as shown in FIG. 26(c), the ON resistances of the first and second PMOS transistors TP11 and TP21 increase while the ON resistances of the first and second NMOS transistors TN11 and TN21 decrease. This increases the potential difference between the nodes N21 and N1 and reduces the potential difference between the nodes N1 and N22.

The first operational amplifier OP1 outputs the first control signal S11 having a high voltage based on the potential difference between the nodes N21 and N1, and the second operational amplifier OP2 outputs the second control signal S12 having a high voltage based on the potential difference between the nodes N1 and N22.

The third PMOS transistor TP22 is turned off in response to the first control signal S11 of a high voltage. This causes the first PMOS transistor TP11 to perform a charge operation at a high degree of conductivity in response to the H-level first phase difference signal UP. The third NMOS transistor TN22 is turned on at a high degree of conductivity in response to the second control signal S12 of a high voltage. As a result, the voltage level of the second phase difference signal DN falls, reducing the degree of conductivity of the first NMOS transistor TN11. This reduces the discharge amount of the first NMOS transistor TN11. In this manner, the discharge amount per unit time is reduced to compensate for the balance between the charge amount and the discharge amount.

Figure 27:
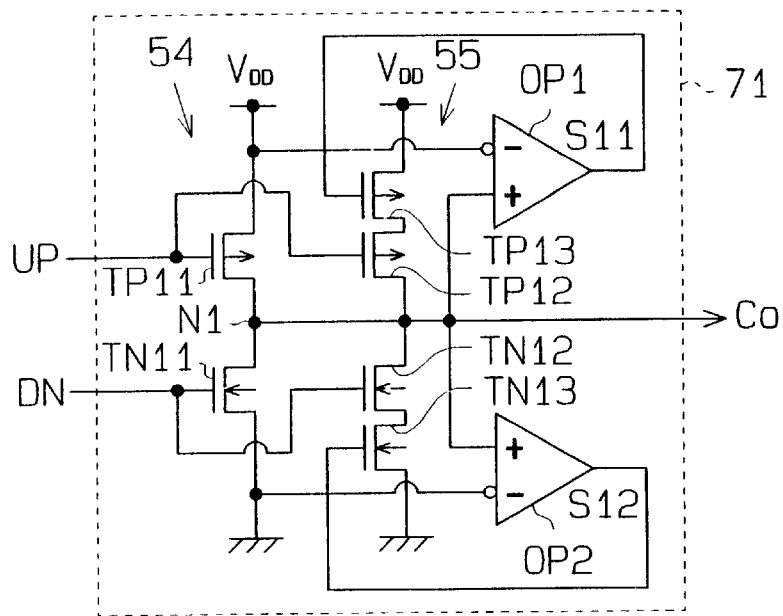
FIG. 27 is a circuit diagram of a charge pump according to a fifth embodiment of the invention.

FIG. 27 is a circuit diagram of a charge pump 71 according to the fifth embodiment of the invention. The charge pump 71 includes first to third PMOS transistors TP11 to TP13, first to third NMOS transistors TN11 to TN13, and first and second operational amplifiers OP1 and OP2. The first PMOS transistor TP11 and the first NMOS transistor TN11 form a first C/D circuit 54. The second and third PMOS transistors TP12 and TP13 and the second and third NMOS transistors TN12 and TN13 form a second C/D circuit 55. The first and second operational amplifiers OP1 and OP2 serve as a detection circuit for detecting whether the voltage of the output signal Co is increased close to the voltage of the high-potential voltage supply $V_{DD}$ or the voltage of the low-potential voltage supply $V_{SS}$. The second C/D circuit 55 operates to make the charge amount greater than the discharge amount when the voltage of the output signal Co is increased close to the voltage of the high-potential voltage supply $V_{DD}$, and operates to make the discharge amount greater than the charge amount when the voltage of the output signal Co is decreased close to the voltage of the low-potential voltage supply $V_{SS}$. As the connection of the first to third PMOS transistors TP11–TP13 and the first to third NMOS transistors TN11–TN13 is the same as that of the second embodiment, a detailed description thereof will not be repeated.

The first operational amplifier OP1 has a non-inverting input terminal connected to the drain (node N1) of the first PMOS transistor TP11, an inverting input terminal connected to the source of the first PMOS transistor TP11 and an output terminal connected to the gate of the third PMOS transistor TP13. The first operational amplifier OP1 provides the third PMOS transistor TP13 with the first control signal S11 having a predetermined voltage based on the drain-source voltage of the first PMOS transistor TP11 (the differential voltage between the voltage V(N1) of the node N1 and the voltage of the high-potential voltage supply $V_{DD}$).

When the voltage of the output signal Co is increased close to the voltage of the high-potential voltage supply $V_{DD}$ for example, the voltage difference across both input terminals of the first operational amplifier OP1 is small. Accordingly, the first operational amplifier OP1 outputs the first control signal S11 of a low voltage. The third PMOS transistor TP13 is turned on at a high degree of conductivity in response to the low-voltage first control signal S11. As a result, the charge amount is increased by the first to third PMOS transistors TP11–TP13. When the voltage of the output signal Co is decreased close to the voltage of the low-potential voltage supply $V_{SS}$, the voltage difference across both input terminals of the first operational amplifier OP1 is large. Accordingly, the first operational amplifier OP1 outputs the first control signal S11 of a high voltage. The third PMOS transistor TP13 is turned on at a low degree of conductivity or turned off in response to the high-voltage first control signal S1. As a result, the charge amount is decreased by the first to third PMOS transistors TP11–TP13.

The second operational amplifier OP2 has a non-inverting input terminal connected to the drain (node N1) of the first NMOS transistor TN11, an inverting input terminal connected to the source of the first NMOS transistor TN11 and an output terminal connected to the gate of the third NMOS transistor TN13. The second operational amplifier OP2 provides the third NMOS transistor TN13 with the second control signal S12 having a predetermined voltage based on the drain-source voltage of the first NMOS transistor TN11 (the differential voltage between the voltage V(N1) of the node N1 and the voltage of the low-potential voltage supply $V_{SS}$). As the degree of conductivity of the third NMOS transistor TN13 changes in response to the second control signal S12, the discharge amount is adjusted.

Figure 28:
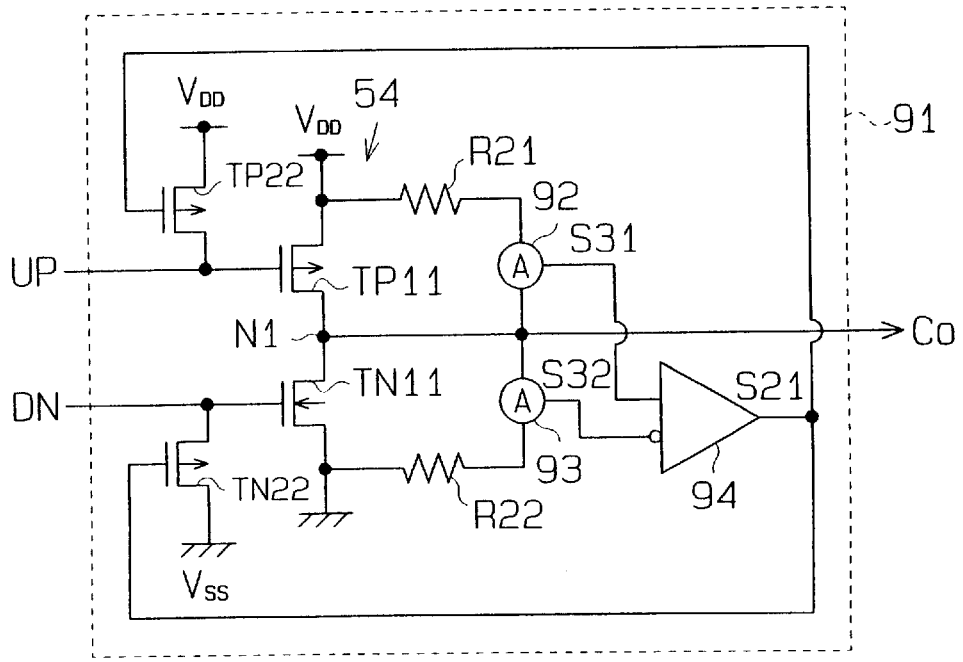
FIG. 28 is a circuit diagram of a charge pump according to a sixth embodiment of the invention.

FIG. 28 is a circuit diagram of a charge pump 91 according to a sixth embodiment of the invention. The charge pump 91 includes first and second PMOS transistors TP11 and TP22, first and second NMOS transistors TN11 and TN22, resistors R21 and R22, first and second current detection circuits 92 and 93 and a comparator 94. Since the connection of the first and second PMOS transistors TP11 and TP22 and the first and second NMOS transistors TN11 and TN22 is the same as that of the fourth embodiment, its detailed description will be omitted.

A series circuit of the resistor R21 and the first current detection circuit 92 is connected in parallel between the source and drain of the first PMOS transistor TP11. The first current detection circuit 92 is a current-voltage converter (I–V converter) and outputs a first detection signal S31 whose voltage corresponds to the current that flows across the resistor R21.

The current flowing across the resistor R21 corresponds to the current that flows in the first PMOS transistor TP11 (i.e., the charge amount by the first C/D circuit 54). Therefore, the first current detection circuit 92 outputs the first detection signal S31 whose voltage corresponds to the charge amount. In other words, the resistor R21 and the first current detection circuit 92 serve as a detection circuit for detecting the charge amount (pump-out amount).

A series circuit of the resistor R22 and the second current detection circuit 93 is connected in parallel between the source and drain of the first NMOS transistor TN11. The second current detection circuit 93 is a current-voltage converter (I–V converter) and outputs a second detection signal S32 whose voltage corresponds to the current that flows across the resistor R22.

The current flowing across the resistor R22 corresponds to the current that flows in the first NMOS transistor TN11 (i.e., the discharge amount by the first C/D circuit 54). Therefore, the second current detection circuit 93 outputs the second detection signal S32 having a voltage that corresponds to the discharge amount.

The comparator 94 has a non-inverting input terminal for receiving the first detection signal S31 and an inverting input terminal for receiving the second detection signal S32. The comparator 94 samples the first and second detection signals S31 and S32, compares both signals S31 and S32 with each other, and outputs a control signal S21 representing the comparison result. When the voltage of the second detection signal S32 is higher than the voltage of the first detection signal S31 (when the discharge amount per unit time is greater than the charge amount), the comparator 94 outputs the control signal S21 having an H level. When the voltage of the first detection signal S31 is higher than the voltage of the second detection signal S32 (when the charge amount per unit time is greater than the discharge amount), the comparator 94 outputs the control signal S21 having an L level. The resistors R21 and R22, the first and second current detection circuits 92 and 93 and the comparator 94 form a charge/discharge amount detection circuit. Instead of the sampling operation of the comparator 94 for sampling the first and second detection signals S31 and S32, the first and second current detection circuits 92 and 93 may respectively latch the first and second detection signals S31 and S32.

The second PMOS transistor TP22 is turned off (the degree of conductivity becomes lower) in response to the H-level control signal S21. As a result, the first PMOS transistor TP11 is turned on to carry out a charge operation in response to the L-level first phase difference signal UP. The second NMOS transistor TN22 is turned on (the degree of conductivity becomes higher) in response to the H-level control signal S21. Consequently, the voltage of the second phase difference signal DN drops, lowering the degree of conductivity of the first NMOS transistor TN11. This results in a reduction in the discharge amount by the first NMOS transistor TN11.

The second NMOS transistor TN22 is turned off (the degree of conductivity becomes lower) in response to the L-level control signal S21. As a result, the first NMOS transistor TN11 is turned on to carry out a discharge operation in response to the H-level second phase difference signal DN. The second PMOS transistor TP22 is turned on (the degree of conductivity becomes higher) in response to the L-level control signal S21. Consequently, the voltage of the first phase difference signal UP rises, reducing the degree of conductivity of the first PMOS transistor TP11. As a result, the charge amount by the first PMOS transistor TP11 is reduced.

In short, the charge pump 91 of the sixth embodiment adjusts the degrees of conductivity of the first PMOS and NMOS transistors TP11 and TN11 in accordance with the amounts of the currents that flow in the transistors TP11 and TN11. Accordingly, the balance between the charge amount and the discharge amount is compensated for.

Figure 29:
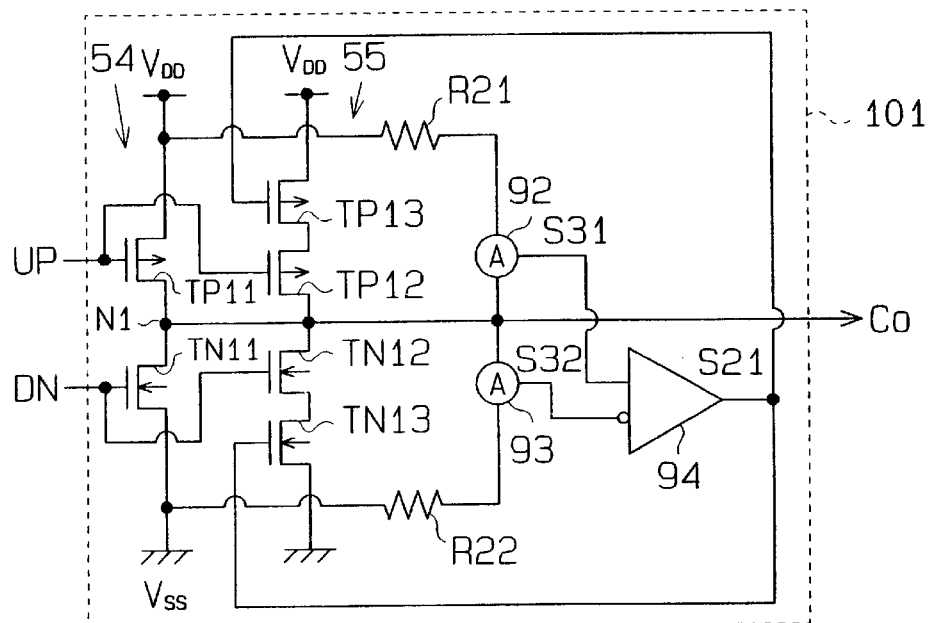
FIG. 29 is a circuit diagram of a charge pump according to a seventh embodiment of the invention.

FIG. 29 is a circuit diagram of a charge pump 101 according to a seventh embodiment of the invention. The charge pump 101 uses the charge/discharge amount detection circuit of the sixth embodiment to control the second C/D circuit 55 of the second embodiment (FIG. 17). The charge pump 101 includes first to third PMOS transistors TP11 to TP13, first to third NMOS transistors TN11 to TN13, resistors R1 and R22, first and second current detection circuits 92 and 93 and a comparator 94.

When the charge amount per unit time is greater than the discharge amount, the third PMOS transistor TP13 is turned off and the third NMOS transistor TN13 is turned on, both in response to the H-level control signal S21 from the comparator 94. As a result, only the first C/D circuit 54 performs a charge operation, and the first and second C/D circuits 54 and 55 perform a discharge operation. When the voltage of the output signal Co is high and the pump-out current (charge amount) is large, therefore, the operations of the first and third NMOS transistors TN11 and TN13 increase the discharge amount of the charge pump 101.

When the discharge amount per unit time is greater than the charge amount, the third PMOS transistor TP13 is turned on and the third NMOS transistor TN13 is turned off, both in response to the L-level control signal S21 from the comparator 94. As a result, the first and second C/D circuits 54 and 55 perform a charge operation, and the first C/D circuit 54 alone performs a discharge operation. When the voltage of the output signal Co is low and the pump-up current (discharge amount) is large, therefore, the operations of the first and third PMOS transistors TP11 and TP13 increase the charge amount.

Although this embodiment preferably employs the first and second C/D circuits 54 and 55, the first to third C/D circuits 54–56 or a greater number of C/D circuits may be used in a charge pump.

Figure 30:
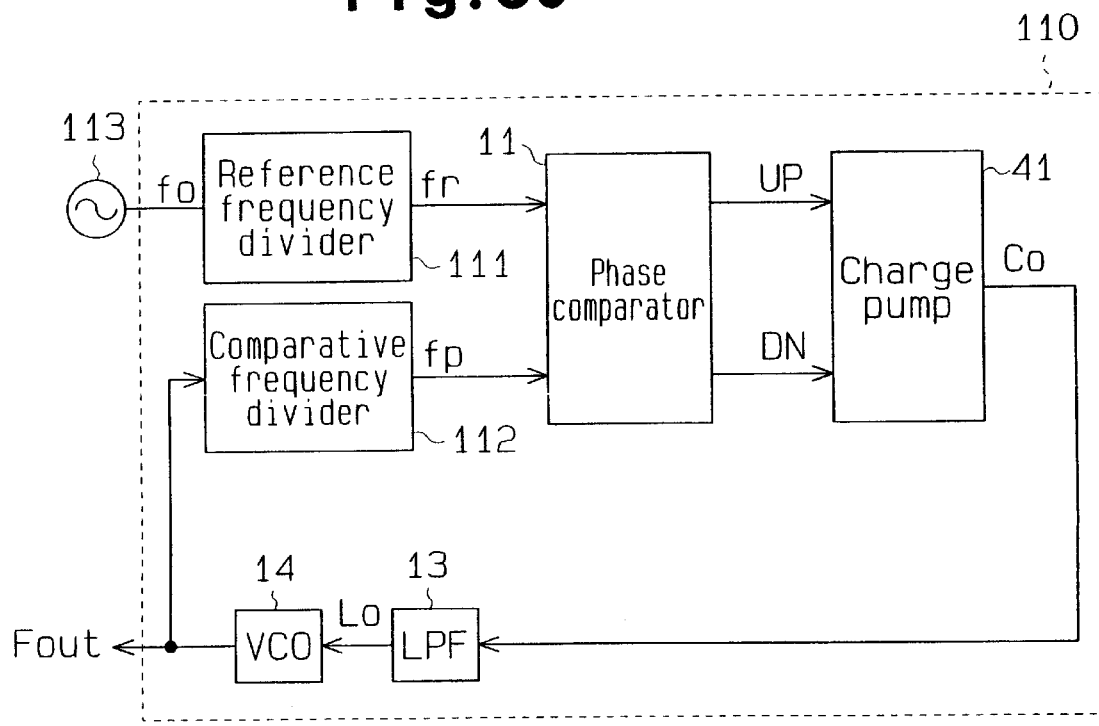
FIG. 30 is a schematic block circuit diagram of a PLL frequency synthesizer including a charge pump in accordance with the present invention.

Any of the charge pumps 41, 51, 51a, 61, 71, 91 and 101 of the individual embodiments may be used in a PLL frequency synthesizer. FIG. 30 is a block circuit diagram of a PLL frequency synthesizer 110. The PLL frequency synthesizer 110 has a phase comparator 11, a charge pump 41, a low-pass filter (LPF) 13, a voltage controlled oscillator (VCO) 14, a reference frequency divider 111 and a comparative frequency divider 112.

The reference frequency divider 111 frequency-divides a crystal oscillation signal fo having a specific frequency, generated by a crystal oscillator 113, yielding a reference signal fr which is supplied to the phase comparator 11. The comparative frequency divider 112 frequency-divides the oscillation output signal Fout from the VCO 14, yielding a comparison signal fp which is also supplied to the phase comparator 11. The phase comparator 11 compares the phase of the reference signal fr with the phase of the comparison signal fp, and supplies the first phase difference signal UP and the second phase difference signal DN to the charge pump 41 based on the comparison result. In accordance with the first and the second phase difference signals UP and DN, the charge pump 41 supplies a predetermined voltage signal Co to the LPF 13. The LPF 13 smoothes the voltage signal Co from the charge pump 41 and sends a high-frequency component removed control signal Lo to the VCO 14. The VCO 14 sends out the oscillation output signal Fout whose frequency corresponds to the voltage value of the control signal Lo as the output signal of the PLL frequency synthesizer 110. This oscillation output signal Fout is fed back to the comparative frequency divider 112.

When the frequency of the output signal Fout is lower than the desired frequency (when the frequency of the comparison signal fp is lower than the frequency of the reference signal fr), the phase comparator 11 outputs the first and second phase difference signals UP and DN having pulse widths corresponding to the phase difference between both signals fr and fp. The charge pump 41 supplies the predetermined voltage signal Co to the LPF 13 in accordance with the pulse widths of the phase difference signals UP and DN. The LPF 13 supplies the control signal Lo of a high voltage to the VCO 14 based on the voltage signal Co. The VCO 14 sends out the oscillation output signal Fout having a high frequency in response to the control signal Lo.

When the frequency of the output signal Fout is higher than the desired frequency (when the frequency of the comparison signal fp is higher than the frequency of the reference signal fr), the phase comparator 11 and the charge pump 41 cause the LPF 13 to send the control signal Lo of a low voltage to the VCO 14. The VCO 14 sends out the oscillation output signal Fout having a low frequency in response to the control signal Lo.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A charge pump comprising:

a charge/discharge circuit for performing a charge operation in response to a first pulse signal, performing a discharge operation in response to a second pulse signal, and outputting an output signal having a voltage based on the charge operation and the discharge operation from an output terminal;

a detection circuit, connected to the charge/discharge circuit, for detecting a status of the charge operation and the discharge operation and generating a control signal representing a detection result; and an adjusting circuit, connected to the detection circuit and the charge/discharge circuit, for adjusting the charge operation and the discharge operation such that a charge amount and a discharge amount per unit time become substantially equal to each other, wherein the detection circuit detects whether the voltage of the output signal is increased close to a voltage of a high-potential voltage supply or decreased close to a voltage of a low-potential voltage supply; and the adjusting circuit adjusts the charge operation and the discharge operation to reduce a discharge operation when the voltage of the output signal is increased close to the voltage of the high-potential voltage supply and to reduce a charge operation when the voltage of the output signal is decreased close to the voltage of the low-potential voltage supply.

2. A charge pump comprising:

a charge/discharge circuit for performing a charge operation in response to a first pulse signal, a discharge operation in response to a second pulse signal, and outputting an output signal having a voltage based on the charge operation and the discharge operation from an output terminal;

a detection circuit, connected to the charge/discharge circuit, for detecting a status of the charge operation and the discharge operation and generating a control signal representing a detection result; and an adjusting circuit, connected to the detection circuit and the charge/discharge circuit, for adjusting the charge operation and the discharge operation such that a charge amount and a discharge amount per unit time become substantially equal to each other, wherein the charge/discharge circuit includes a charge circuit connected between a high-potential voltage supply and the output terminal and a discharge circuit connected between a low-potential voltage supply and the output terminal;

the detection circuit detects a first voltage difference between a voltage of the high-potential voltage supply and the voltage of the output terminal and a second voltage difference between a voltage of the low-potential voltage supply and the voltage of the output terminal; and the adjusting circuit adjusts the charge operation and the discharge operation to reduce a drive performance of the charge circuit when the first voltage difference is higher than the second voltage difference and to reduce a drive performance of the discharge circuit when the second voltage difference is higher than the first voltage difference.

3. A charge pump comprising:

a charge/discharge circuit for performing a charge operation in response to a first pulse signal, a discharge operation in response to a second pulse signal, and outputting an output signal having a voltage based on the charge operation and the discharge operation from an output terminal;

a detection circuit, connected to the charge/discharge circuit, for detecting a status of the charge operation and the discharge operation and generating a control signal representing a detection result; and an adjusting circuit, connected to the detection circuit and the charge/discharge circuit, for adjusting the charge operation and the discharge operation such that a charge amount and a discharge amount per unit time become substantially equal to each other, wherein the charge/discharge circuit includes a charge circuit connected between a high-potential voltage supply and the output terminal and a discharge circuit connected between a low-potential voltage supply and the output terminal;

the detection circuit detects an amount of a first current flowing in the charge circuit and an amount of a second current flowing in the discharge circuit, and generates the control signal based on a difference between the first and second currents; and the adjusting circuit adjusts the charge operation and the discharge operation to reduce a drive performance of the charge circuit when the first current is larger than the second current and to reduce a drive performance of the discharge circuit when the second current is larger than the first current.

4. A charge pump comprising:

a charge/discharge circuit for performing a charge operation in response to a first pulse signal, a discharge operation in response to a second pulse signal, and outputting an output signal having a voltage based on the charge operation and the discharge operation from an output terminal;

a detection circuit, connected to the charge/discharge circuit, for detecting a status of the charge operation and the discharge operation and generating a control signal representing a detection result; and an adjusting circuit, connected to the detection circuit and the charge/discharge circuit, for adjusting the charge operation and the discharge operation such that a charge amount and a discharge amount per unit time become substantially equal to each other, wherein the detection circuit detects whether the voltage of the output signal is increased close to a voltage of a high-potential voltage supply or decreased close to a voltage of a low-potential voltage supply; and the adjusting circuit adjusts the charge operation and the discharge operation to enhance a charge performance when the voltage of the output signal is increased close to the voltage of the high-potential voltage supply and to enhance a discharge performance when the voltage of the output signal is decreased close to the voltage of the low-potential voltages supply.

5. A charge pump comprising:

a charge/discharge circuit for performing a charge operation in response to a first pulse signal, a discharge operation in response to a second pulse signal, and outputting an output signal having a voltage based on the charge operation and the discharge operation from an output terminal;

a detection circuit, connected to the charge/discharge circuit, for detecting a status of the charge operation and the discharge operation and generating a control signal representing a detection result; and an adjusting circuit, connected to the detection circuit and the charge/discharge circuit, for adjusting the charge operation and the discharge operation such that a charge amount and a discharge amount per unit time become substantially equal to each other, wherein the charge/discharge circuit includes a charge circuit connected between a high-potential voltage supply and the output terminal and a discharge circuit connected between a low-potential voltage supply and the output terminal;

the detection circuit detects a first voltage difference between a voltage of the high-potential voltage supply and the voltage of the output terminal and a second voltage difference between a voltage of the low-potential voltage supply and the voltage of the output terminal; and the adjusting circuit adjusts the charge operation and the discharge operation to enhance a drive performance of the discharge circuit when the first voltage difference is higher than the second voltage difference and to enhance a drive performance of the charge circuit when the second voltage difference is higher than the first voltage difference.

6. A charge pump comprising:

a charge/discharge circuit for performing a charge operation in response to a first pulse signal, a discharge operation in response to a second pulse signal, and outputting an output signal having a voltage based on the charge operation and the discharge operation from an output terminal;

a detection circuit, connected to the charge/discharge circuit, for detecting a status of the charge operation and the discharge operation and generating a control signal representing a detection result; and an adjusting circuit, connected to the detection circuit and the charge/discharge circuit, for adjusting the charge operation and the discharge operation such that a charge amount and a discharge amount per unit time become substantially equal to each other, wherein the charge/discharge circuit includes a charge circuit connected between a high-potential voltage supply and the output terminal and a discharge circuit connected between a low-potential voltage supply and the output terminal;

the detection circuit detects an amount of a first current flowing in the charge circuit and an amount of a second current flowing in the discharge circuit, and generates the control signal based on a difference between the amounts of the first and second charge currents; and the adjusting circuit adjusts the charge operation and the discharge operation to enhance a drive performance of the discharge circuit when the first current is larger than the second current and to enhance a drive performance of the charge circuit when the second current is larger than the first current.

7. A charge pump comprising:

charge and discharge transistors connected in series between a high-potential voltage supply and a low-potential voltage supply;

a first transistor, a resistor and a second transistor connected in series between the high-potential voltage supply and the low-potential voltage supply;

a third transistor connected between a first node between the first transistor and the resistor, and a gate of the charge transistor and responsive to a first pulse signal; and a fourth transistor connected between a second node between the second transistor and the resistor, and a gate of the discharge transistor and responsive to a second pulse signal, wherein the gates of the first and second transistors are connected to a third node between the charge transistor and the discharge transistor.

8. A charge pump comprising:

a main charge transistor and a main discharge transistor connected in series between a high-potential voltage supply and a low-potential voltage supply;

a group of auxiliary charge transistors including first and second auxiliary charge transistors connected in series between a node between the main charge transistor and the main discharge transistor, and the high-potential voltage supply;

a group of auxiliary discharge transistors including first and second auxiliary discharge transistors connected in series between the node and the low-potential voltage supply; and an A/D converter, connected to the node, for converting an analog signal at the node to a digital signal, a gate of the first auxiliary charge transistor being connected to a gate of the main charge transistor, a gate of the second auxiliary charge transistor being responsive to the digital signal, a gate of the first auxiliary discharge transistor being connected to a gate of the main discharge transistor, and a gate of the second auxiliary discharge transistor being responsive to the digital signal.

9. The charge pump according to claim 8, wherein the group of auxiliary charge transistors further includes third and fourth auxiliary charge transistors connected between the node and the high-potential voltage supply, a gate of the third auxiliary charge transistor being connected to the gate of the main charge transistor, a gate of the fourth auxiliary charge transistor being responsive to the digital signal; and the group of auxiliary discharge transistors further includes third and fourth auxiliary discharge transistors connected between the node and the low-potential voltage supply, a gate of the third auxiliary discharge transistor being connected to the gate of the main discharge transistor, and a gate of the fourth auxiliary discharge transistor being responsive to the digital signal.

10. The charge pump according to claim 8, further comprising a decoder, connected to the A/D converter, for receiving the digital signal and decoding the digital signal to generate a decoded digital signal.

11. A charge pump comprising:

a charge transistor and a discharge transistor connected in series between a high-potential voltage supply and a low-potential voltage supply;

first and second transistors connected in series between the charge transistor and the discharge transistor, a gate of the first transistor being connected to a first node between the first transistor and the charge transistor, a gate of the second transistor being connected to a second node between the second transistor and the discharge transistor;

a first operational amplifier having a first input terminal connected to the first node, a second input terminal connected to a third node between the first and second transistors, and an output terminal;

a second operational amplifier having a first input terminal connected to the second node, a second input terminal connected to the third node, and an output terminal;

a third transistor connected between the high-potential voltage supply and a gate of the charge transistor; and a fourth transistor connected between the low-potential voltage supply and a gate of the discharge transistor, a gate of the third transistor being connected to the output terminal of the first operational amplifier, and a gate of the fourth transistor being connected to the output terminal of the second operational amplifier.

12. A charge pump comprising:

a charge transistor and a discharge transistor connected in series between a high-potential voltage supply and a low-potential voltage supply;

a group of auxiliary charge transistors including first and second auxiliary charge transistors connected in series between the high-potential voltage supply and a first node between the charge transistor and the discharge transistor;

a group of auxiliary discharge transistors including first and second auxiliary discharge transistors connected in series between the low-potential voltage supply and the first node;

a first operational amplifier having a first input terminal connected to the first node, a second input terminal connected to a second node between the high-potential voltage supply and the charge transistor, and an output terminal; and a second operational amplifier having a first input terminal connected to the first node, a second input terminal connected to a third node between the low-potential voltage supply and the discharge transistor, and an output terminal, a gate of the first auxiliary charge transistor being connected to a gate of the charge transistor, a gate of the second auxiliary charge transistor being connected to the output terminal of the first operational amplifier, a gate of the first auxiliary discharge transistor being connected to a gate of the discharge transistor, and a gate of the second auxiliary discharge transistor being connected to the output terminal of the second operational amplifier.

13. A charge pump comprising:

a charge transistor and a discharge transistor connected in series between a high-potential voltage supply and a low-potential voltage supply;

a first resistor and a first current detection circuit connected in series between a first node between the charge transistor and the discharge transistor, and a second node between the high-potential voltage supply and the charge transistor;

a second resistor and a second current detection circuit connected in series between the first node and a third node between the low-potential voltage supply and the discharge transistor;

an operational amplifier having a first input terminal connected to an output of the first current detection circuit, a second input terminal connected to an output of the second current detection circuit, and an output terminal;

a first transistor connected between the high-potential voltage supply and a gate of the charge transistor; and a second transistor connected between the low-potential voltage supply and a gate of the discharge transistor, the first and second transistors having gates connected to the output terminal of the operational amplifier.

14. A charge pump comprising:

a charge transistor and a discharge transistor connected in series between a high-potential voltage supply and a low-potential voltage supply;

a group of auxiliary charge transistors including first and second auxiliary charge transistors connected in series between the high-potential voltage supply and a first node between the charge transistor and the discharge transistor;

a group of auxiliary discharge transistors including first and second auxiliary discharge transistors connected in series between the low-potential voltage supply and the first node;

a first resistor and a first current detection circuit connected in series between the first node and a second node between the charge transistor and the high-potential voltage supply;

a second resistor and a second current detection circuit connected in series between the first node and a third node between the discharge transistor and the low-potential voltage supply;

an operational amplifier having a first input terminal connected to an output of the first current detection circuit, a second input terminal connected to an output of the second current detection circuit, and an output terminal; and a gate of the first auxiliary charge transistor being connected to a gate of the charge transistor, a gate of the second auxiliary charge transistor being connected to the output terminal of the operational amplifier, a gate of the first auxiliary discharge transistor being connected to a gate of the discharge transistor, and a gate of the second auxiliary discharge transistor being connected to the output terminal of the operational amplifier.

15. A phase Locked Loop(PLL) circuit comprising:

a phase comparator receiving a reference signal and a comparison signal and generating first and second phase difference signals having pulse widths based on a phase difference between the first and second phase difference signals;

a charge pump, connected to the phase comparator, receiving the first and second phase difference signals and generating an output signal having a predetermined voltage based on the first and second phase difference signals, wherein the charge pump includes charge and discharge transistors connected in series between a high-potential voltage supply and a low-potential voltage supply and responsive to the first and second phase difference signals, a first transistor, a resistor and a second transistor connected in series between the high-potential voltage supply and the low-potential voltage supply;

a third transistor connected between a first node between the first transistor and the resistor, and a gate of the charge transistor and responsive to a first phase difference signal, and a fourth transistor connected between a second node between the second transistor and the resistor, and a gate of the discharge transistor and responsive to a second phase difference signal, wherein the output signal is provided at a third node between the charge transistor and the discharge transistor, and the gates of the first and second transistors are connected to the third node; and a voltage controlled oscillator, connected to the charge pump, for generating an oscillation output signal having a frequency which corresponds to a voltage of the charge pump output signal.

16. The PLL circuit according to claim 15, further comprising a frequency divider, connected between the voltage controlled oscillator and the phase comparator, for frequency dividing the oscillation output signal and generating the comparison signal.

17. The PLL circuit according to claim 15, further comprising:

a reference frequency divider, connected to the phase comparator, for frequency dividing an oscillation signal having a predetermined frequency and generating the reference signal having a reference frequency; and a comparative frequency divider, connected between the voltage controlled oscillator and the phase comparator, for frequency dividing the oscillation output signal and generating the comparison signal.

18. A Phase Locked Loop(PLL) circuit comprising:

a phase comparator receiving a reference signal and a comparison signal and generating first and second phase difference signals having pulse widths based on the phase difference between the first and second phase difference signals;

a charge pump, connected to the phase comparator, receiving the first and second phase difference signals and generating at an output terminal, an output signal having a predetermined voltage based on the first and second phase difference signals, wherein the charge pump includes a main charge transistor and a main discharge transistor connected in series between a high-potential voltage supply and a low-potential voltage supply and responsive to the first and second phase difference signals, wherein the output terminal comprises a node between the main charge transistor and the main discharge transistor, a group of auxiliary charge transistors including first and second auxiliary charge transistors connected in series between the node and the high-potential voltage supply, a group of auxiliary discharge transistors including first and second auxiliary discharge transistors connected in series between the node and the low-potential voltage supply, and an A/D converter, connected to the node, for converting an analog signal at the node to a digital signal, a gate of the first auxiliary charge transistor being connected to a gate of the main charge transistor, a gate of the second auxiliary charge transistor being responsive to the digital signal, a gate of the first auxiliary discharge transistor being connected to a gate of the main discharge transistor, and a gate of the second auxiliary discharge transistor being responsive to the digital signal; and a voltage controlled oscillator, connected to the charge pump, for generating an oscillation output signal having a frequency which corresponds to a voltage value of the charge pump output signal.

19. The PLL circuit according to claim 18, wherein the group of auxiliary charge transistors further includes third and fourth auxiliary charge transistors connected between the node and the high-potential voltage supply, a gate of the third auxiliary charge transistor being connected to the gate of the main charge transistor, and a gate of the fourth auxiliary charge transistor being responsive to the digital signal; and the group of auxiliary discharge transistors further includes third and fourth auxiliary discharge transistors connected between the node and the low-potential voltage supply, a gate of the third auxiliary discharge transistor being connected to the gate of the main discharge transistor, and a gate of the fourth auxiliary discharge transistor being responsive to the digital signal.

20. The PLL circuit according to claim 18, further comprising a frequency divider, connected between the voltage controlled oscillator and the phase comparator, for frequency dividing the oscillation output signal and generating the comparison signal.

21. The PLL circuit according to claim 18, further comprising:

a reference frequency divider, connected to the phase comparator, for frequency dividing an oscillation signal having a predetermined frequency and generating the reference signal having a reference frequency; and a comparative frequency divider, connected between the voltage controlled oscillator and the phase comparator, for frequency dividing the oscillation output signal and generating the comparison signal.

22. A Phase Locked Loop(PLL) circuit comprising:

a phase comparator receiving a reference signal and a comparison signal and generating first and second phase difference signals having pulse widths based on the phase difference between the first and second phase difference signals;

a charge pump, connected to the phase comparator, receiving the first and second phase difference signals and generating an output signal having a predetermined voltage based on the first and second phase difference signals, wherein the charge pump includes a charge transistor and a discharge transistor connected in series between a high-potential voltage supply and a low-potential voltage supply and responsive to the first and second phase difference signals, first and second transistors connected in series between the charge transistor and the discharge transistor, a gate of the first transistor being connected to a first node between the first transistor and the charge transistor, a gate of the second transistor being connected to a second node between the second transistor and the discharge transistor, a first operational amplifier having a first input terminal connected to the first node, a second input terminal connected to a third node between the first and second transistors, and an output terminal, the third node being an output terminal of the output signal of the charge pump, a second operational amplifier having a first input terminal connected to the second node, a second input terminal connected to the third node, and an output terminal, a third transistor connected between the high-potential voltage supply and a gate of the charge transistor, and a fourth transistor connected between the low-potential voltage supply and a gate of the discharge transistor, a gate of the third transistor being connected to the output terminal of the first operational amplifier, and a gate of the fourth transistor being connected to the output terminal of the second operational amplifier; and a voltage controlled oscillator, connected to the charge pump, for generating an oscillation output signal having a frequency which corresponds to a voltage value of the charge pump output signal.

23. The PLL circuit according to claim 22, further comprising a frequency divider, connected between the voltage controlled oscillator and the phase comparator, for frequency dividing the oscillation output signal and generating the comparison signal.

24. The PLL circuit according to claim 22, further comprising:

a reference frequency divider, connected to the phase comparator, for frequency dividing an oscillation signal having a predetermined frequency and generating the reference signal having a reference frequency; and a comparative frequency divider, connected between the voltage controlled oscillator and the phase comparator, for frequency dividing the oscillation output signal and generating the comparison signal.

25. A Phase Locked Loop(PLL) circuit comprising:

a phase comparator receiving a reference signal and a comparison signal and generating first and second phase difference signals having pulse widths based on the phase difference between the first and second phase difference signals;

a charge pump, connected to the phase comparator, receiving the first and second phase difference signals and generating an output signal having a predetermined voltage based on the first and second phase difference signals, wherein the charge pump includes a charge transistor and a discharge transistor connected in series between a high-potential voltage supply and a low-potential voltage supply and responsive to the first and second phase difference signals, a group of auxiliary charge transistors including first and second auxiliary charge transistors connected in series between the high-potential voltage supply and a first node between the charge transistor and the discharge transistor, the first node being an output terminal of the output signal of the charge pump, a group of auxiliary discharge transistors including first and second auxiliary discharge transistors connected in series between the low-potential voltage supply and the first node, a first operational amplifier having a first input terminal connected to the first node, a second input terminal connected to a second node between the high-potential voltage supply and the charge transistor, and an output terminal, and a second operational amplifier having a first input terminal connected to the first node, a second input terminal connected to a third node between the low-potential voltage supply and the discharge transistor, and an output terminal, a gate of the first auxiliary charge transistor being connected to a gate of the charge transistor, a gate of the second auxiliary charge transistor being connected to the output terminal of the first operational amplifier, a gate of the first auxiliary discharge transistor being connected to a gate of the discharge transistor, and a gate of the second auxiliary discharge transistor being connected to the output terminal of the second operational amplifier; and a voltage controlled oscillator, connected to the charge pump, for generating an oscillation output signal having a frequency which corresponds to a voltage value of the charge pump output signal.

26. The PLL circuit according to claim 25, further comprising a frequency divider, connected between the voltage controlled oscillator and the phase comparator, for frequency dividing the oscillation output signal and generating the comparison signal.

27. The PLL circuit according to claim 25, further comprising:

a reference frequency divider, connected to the phase comparator, for frequency dividing an oscillation signal having a predetermined frequency and generating the reference signal having a reference frequency; and a comparative frequency divider, connected between the voltage controlled oscillator and the phase comparator, for frequency dividing the oscillation output signal and generating the comparison signal.

28. A Phase Locked Loop(PLL) circuit comprising:

a phase comparator receiving a reference signal and a comparison signal and generating first and second phase difference signals having pulse widths based on the phase difference between the first and second phase difference signals;

a charge pump, connected to the phase comparator, receiving the first and second phase difference signals and generating an output signal having a predetermined voltage based on the first and second phase difference signals, wherein the charge pump includes a charge transistor and a discharge transistor connected in series between a high-potential voltage supply and a low-potential voltage supply and responsive to the first and second phase difference signals, a first node between the charge transistor and the discharge transistor being an output terminal of the output signal of the charge pump, a first resistor and a first current detection circuit connected in series between a first node between the charge transistor and the discharge transistor, and a second node between the high-potential voltage supply and the charge transistor, a second resistor and a second current detection circuit connected in series between the first node and a third node between the low-potential voltage supply and the discharge transistor, an operational amplifier having a first input terminal connected to an output of the first current detection circuit, a second input terminal connected to an output of the second current detection circuit, and an output terminal, a first transistor connected between the high-potential voltage supply and a gate of the charge transistor, and a second transistor connected between the low-potential voltage supply and a gate of the discharge transistor, the first and second transistors having gates connected to the output terminal of the operational amplifier; and a voltage controlled oscillator, connected to the charge pump output terminal, for generating an oscillation output signal having a frequency which corresponds to a voltage value of the output signal from the charge pump.

29. The PLL circuit according to claim 28, further comprising a frequency divider, connected between the voltage controlled oscillator and the phase comparator, for frequency dividing the oscillation output signal and generating the comparison signal.

30. The PLL circuit according to claim 28, further comprising:

a reference frequency divider, connected to the phase comparator, for frequency dividing an oscillation signal having a predetermined frequency and generating the reference signal having a reference frequency; and a comparative frequency divider, connected between the voltage controlled oscillator and the phase comparator, for frequency dividing the oscillation output signal and generating the comparison signal.

31. A Phase Locked Loop(PLL) circuit comprising:

a phase comparator receiving a reference signal and a comparison signal and generating first and second phase difference signals having pulse widths based on the phase difference between the first and second phase difference signals;

a charge pump, connected to the phase comparator, receiving the first and second phase difference signals and generating an output signal having a predetermined voltage based on the first and second phase difference signals, wherein the charge pump includes a charge transistor and a discharge transistor connected in series between a high-potential voltage supply and a low-potential voltage supply and responsive to the first and second phase difference signals, a first node between the charge transistor and the discharge transistor being an output of the output signal of the charge pump, a group of auxiliary charge transistors including first and second auxiliary charge transistors connected in series between the high-potential voltage supply and a first node between the charge transistor and the discharge transistor, a group of auxiliary discharge transistors including first and second auxiliary discharge transistors connected in series between the low-potential voltage supply and the first node, a first resistor and a first current detection circuit connected in series between the first node and a second node between the charge transistor and the high-potential voltage supply, a second resistor and a second current detection circuit connected in series between the first node and a third node between the discharge transistor and the low-potential voltage supply, and an operational amplifier having a first input terminal connected to an output of the first current detection circuit, a second input terminal connected to an output of the second current detection circuit, and an output terminal, a gate of the first auxiliary charge transistor being connected to a gate of the charge transistor, a gate of the second auxiliary charge transistor being connected to the output terminal of the operational amplifier, a gate of the first auxiliary discharge transistor being connected to a gate of the discharge transistor, and a gate of the second auxiliary discharge transistor being connected to the output terminal of the operational amplifier; and a voltage controlled oscillator, connected to the charge pump, for generating an oscillation output signal having a frequency which corresponds to a voltage value of the charge pump output signal.

32. The PLL circuit according to claim 31, further comprising a frequency divider, connected between the voltage controlled oscillator and the phase comparator, for frequency dividing the oscillation output signal and generating the comparison signal.

33. The PLL circuit according to claim 31, further comprising:

a reference frequency divider, connected to the phase comparator, for frequency dividing an oscillation signal having a predetermined frequency and generating the reference signal having a reference frequency; and a comparative frequency divider, connected between the voltage controlled oscillator and the phase comparator, for frequency dividing the oscillation output signal and generating the comparison signal.

* * * * *